(12) United States Patent
Chen et al.

(10) Patent No.: US 11,289,613 B2
(45) Date of Patent: Mar. 29, 2022

(54) ELECTRONIC DEVICE INCLUDING A JUNCTION FIELD-EFFECT TRANSISTOR

(71) Applicant: Semiconductor Components Industries, LLC, Phoenix, AZ (US)

(72) Inventors: Weize Chen, Phoenix, AZ (US); Mark Griswold, Gilbert, AZ (US)

(73) Assignee: SEMICONDUCTOR COMPONENTS INDUSTRIES, LLC, Phoenix, AZ (US)

(*) Notice: Subject to any disclaimer, the term of this patent is extended or adjusted under 35 U.S.C. 154(b) by 136 days.

(21) Appl. No.: 16/674,625

(22) Filed: Nov. 5, 2019

(65) Prior Publication Data

US 2021/0119059 A1    Apr. 22, 2021

Related U.S. Application Data

(60) Provisional application No. 62/916,068, filed on Oct. 16, 2019.

(51) Int. Cl.

| | | |
|---|---|---|
| *H01L 29/00* | (2006.01) | |
| *H01L 29/808* | (2006.01) | |
| *H01L 27/06* | (2006.01) | |
| *H01L 29/40* | (2006.01) | |
| *H01L 29/10* | (2006.01) | |
| *H01L 29/08* | (2006.01) | |
| *H01L 29/423* | (2006.01) | |

(Continued)

(52) U.S. Cl.
CPC ........ *H01L 29/808* (2013.01); *H01L 27/0617* (2013.01); *H01L 29/063* (2013.01); *H01L 29/0843* (2013.01); *H01L 29/1029* (2013.01); *H01L 29/402* (2013.01); *H01L 29/42316* (2013.01); *H01L 29/66901* (2013.01)

(58) Field of Classification Search
None
See application file for complete search history.

(56) References Cited

U.S. PATENT DOCUMENTS

| | | | |
|---|---|---|---|
| 2008/0230812 A1* | 9/2008 | Disney | .......... H01L 27/098 257/272 |
| 2010/0032729 A1 | 2/2010 | Hao et al. | |
| 2011/0079825 A1 | 4/2011 | Tsuchiko | |

(Continued)

OTHER PUBLICATIONS

U.S. Appl. No. 15/965,236, filed Apr. 27, 2018; specification and figures; pp. 1 to 37.

*Primary Examiner* — Reema Patel
(74) *Attorney, Agent, or Firm* — Abel Schillinger, LLP

(57) ABSTRACT

An electronic device can include a JFET that can include a drain contact region, a channel region spaced apart from the drain contact region, and a gate region adjacent the channel region. In an embodiment, the gate region includes a relatively heavier doped portion and a relatively lighter portion closer to the drain contact region. In another embodiment, a gate field electrode can be extended beyond a field isolation structure and overlie a channel of the JFET. In a further embodiment, a region having relatively low dopant concentration can be along the drain side of the conduction path, where the region is between two other more heavily doped regions. In another embodiment, alternating conducting channel and gate regions can be used to allow lateral and vertical pinching off of the conducting channel regions.

18 Claims, 12 Drawing Sheets

(51) Int. Cl.
    *H01L 29/66* (2006.01)
    *H01L 29/06* (2006.01)

(56) References Cited

U.S. PATENT DOCUMENTS

| | | |
|---|---|---|
| 2012/0142149 A1 | 6/2012 | Tsuchiko |
| 2013/0313617 A1 | 11/2013 | Yeh et al. |
| 2014/0139282 A1 | 5/2014 | Yeh et al. |
| 2015/0054038 A1* | 2/2015 | Masliah ............ H01L 29/7832 257/262 |
| 2015/0137192 A1 | 5/2015 | Han |
| 2016/0141418 A1 | 5/2016 | Yeh et al. |
| 2017/0271511 A1 | 9/2017 | Yeh et al. |
| 2018/0175176 A1 | 6/2018 | Tsuchiko |
| 2019/0273169 A1 | 9/2019 | Agam |

* cited by examiner

ELECTRONIC DEVICE INCLUDING A JUNCTION FIELD-EFFECT TRANSISTOR

CROSS REFERENCE TO RELATED APPLICATION

This application claims priority under 35 U.S.C. § 119(e) to U.S. Patent Application No. 62/916,068 entitled "Electronic Device Including a Junction Field-Effect Transistor," by Weize Chen and Mark Griwsold, filed Oct. 16, 2019, which is assigned to the current assignee hereof and incorporated herein by reference in its entirety.

FIELD OF THE DISCLOSURE

The present disclosure relates to electronic devices, and more particularly to, electronic devices that include junction field-effect transistor.

RELATED ART

An electronic device can include a junction field-effect transistor (JFET) that can be used as a high voltage transistor. A particular JFET has top and bottom gate regions and relies on pinch off in a vertical direction. Such JFET can use a well region as part of a top gate region, wherein the well region extends over all of the channel region. The JFET may have relatively low saturation current and output impedance. No lateral grading of dopant concentration for the channel and the gate region can also contribute to poor output impedance. Another JFET can mainly rely on well implants to achieve lateral pinch off of the channel of the JFET. Such a configuration may make it difficult to achieve a low pinch-off voltage and high output impedance due to width and depth limitations. In a further JFET, some portions of the JFET have no gate region, and other portions have only buried doped regions for the gate regions for the JFET. For the portions with the gate regions, there is no shallow sub-surface conduction channel. Depth of the channel is relatively large, and thus, achieving both a low pinch-off voltage and high conductance is difficult. The pinch-off of a vertical channel only occurs in a lateral direction. Similar to the other JFETs, there is no laterally graded transition region or laterally graded drift region.

Further compounding the design of the JFET can be its integration into a process that is compatible with a complementary metal-oxide-semiconductor (CMOS) process technology. Many times, tradeoffs between the characteristics of the high voltage transistors and the CMOS transistors may occur. Optimizing performance of the CMOS transistor may be done to the detriment of the high voltage transistors, and vice versa. Further improvements in high-voltage JFETs without significantly adversely affecting CMOS transistors are desired.

BRIEF DESCRIPTION OF THE DRAWINGS

Embodiments are illustrated by way of example and are not limited in the accompanying figures.

Figure 1:
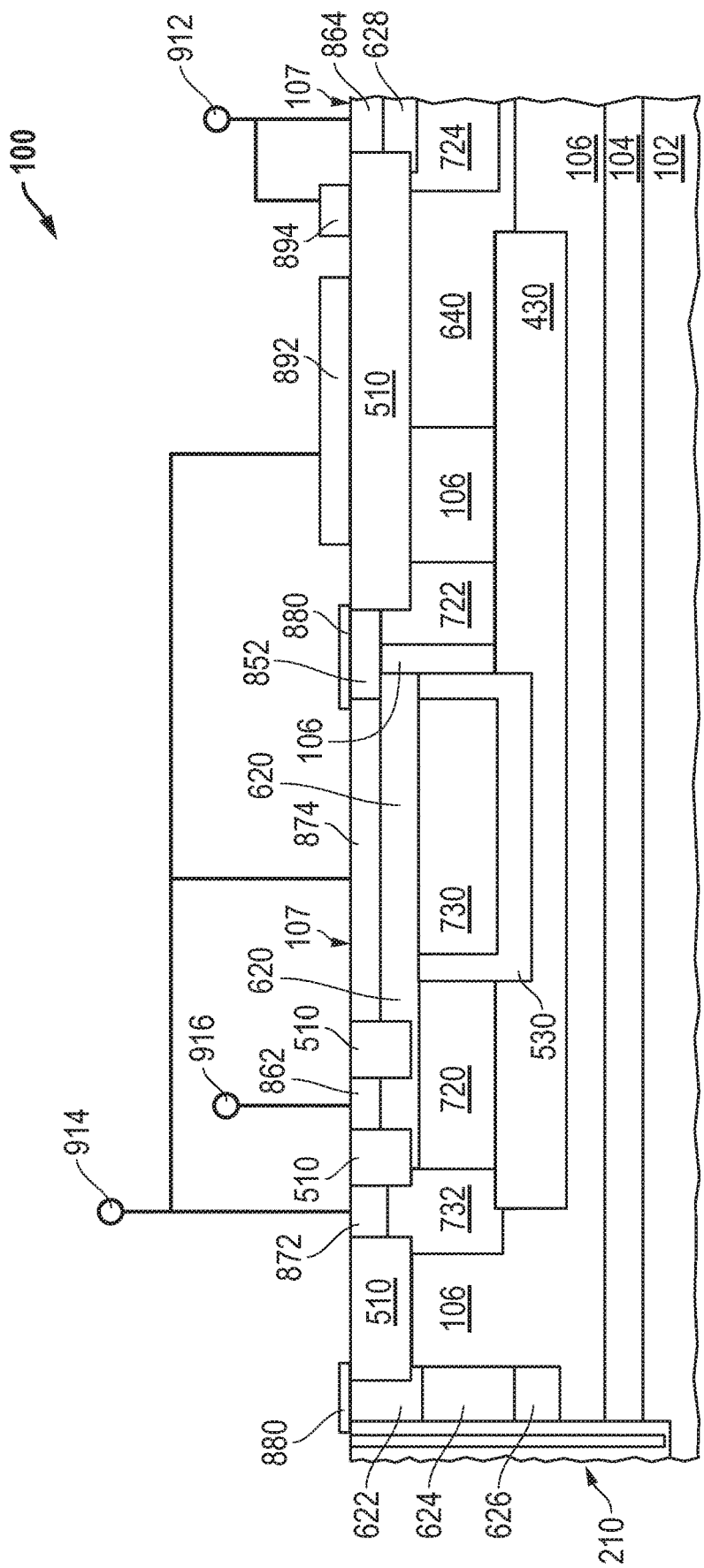
FIG. 1 includes an illustration of a cross-sectional view of a portion of an electronic device that includes a portion of a high-voltage JFET in accordance with an embodiment.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The term "coupling" and its variants are intended to mean the transfer of electrical energy from one electronic component to another. The term "electrically connected" and its variants refer to a specific type of coupling where there is no intervening circuit or electronic component. For example, two electronic components are electrically connected to each other when there is no circuit or a further electronic component along a current path between the two components. Thus, with respect to an electrical connection, electrodes or terminals of the two components are electrically connected at a node and are at substantially the same voltage.

The term "depth," when referring to doped region, is (1) at a pn junction when an underlying doped region or layer has an opposite conductivity type or (2) at a midpoint of a changing dopant concentration profile with an underlying doped region or layer of the same conductivity type.

The term "dopant concentration" refers to an average dopant concentration for a region, a layer, a film, or a portion thereof, unless explicitly stated to the contrary.

The term "high voltage," with reference to a layer, a structure, or a device, means that such layer, structure, or device can withstand at least 20 V difference across such layer, structure, or device (e.g., between a source and a drain of a transistor when in an off-state) without exhibiting dielectric breakdown, avalanche breakdown, or the like.

The term "lateral" and its variants refer to a direction, distance, or offset that is parallel to a major surface of a workpiece, for example, a top surface of an epitaxial semiconductor layer. The term "vertical" and its variants refer to a direction, distance, or offset that is perpendicular to a major surface of a workpiece, for example, a top surface of an epitaxial semiconductor layer.

In a top view of an electronic device, a length of an active region, a channel or a gate region of a transistor is in a direction parallel to current flow when the transistor is in the on-state, and a width of the active region, the channel or the gate region is perpendicular to the length of the gate electrode.

If a transistor structure includes more than one channel region, the effective width of the channel region is the sum of the widths of each channel region for the transistor. If a transistor structure includes more than one gate region, the effective width of the gate regions is the sum of the widths of each gate region for the transistor. For a transistor structure with one channel or gate region, the width of the one channel or gate region is the same as the effective channel or gate width.

The term "offset" refers to a lateral or vertical distance between two objects, such as doped regions, that may or may not lie along the same lateral or vertical plane. For example, a resurf region may be laterally offset from a drain contact region even though the resurf region and the drain contact region do not lie at the same elevation.

The term "voltage rating," with reference to an electronic device, means a nominal voltage that the electronic device is designed to withstand. For example, a transistor with a voltage rating of 50 V is designed for a 50 V difference between drain and source regions or electrodes or collector and emitter regions or electrodes when the transistor is in an off-state. The transistor may be able to withstand a higher voltage, such as 60 V or 70 V, for a limited duration, such as during and shortly after a switching operation, without significantly permanently damaging the transistor.

Group numbers correspond to columns within the Periodic Table of Elements based on the IUPAC Periodic Table of Elements, version dated Nov. 28, 2016.

For clarity of the drawings, certain regions of device structures, such as doped regions or dielectric regions, may be illustrated as having generally straight line edges and precise angular corners. However, those skilled in the art understand that, due to the diffusion and activation of dopants or formation of layers, the edges of such regions generally may not be straight lines and that the corners may not be precise angles.

The terms "on," "overlying," and "over" may be used to indicate that two or more elements are in direct physical contact with each other. However, "over" may also mean that two or more elements are not in direct contact with each other. For example, "over" may mean that one element is above another element, but the elements do not contact each other and may have another element or elements in between the two elements.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not explicitly listed or inherent to such method, article, or apparatus. Further, unless explicitly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

The use of the word "about," "approximately," or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

An electronic device can include a JFET that has one or more features that can provide good performance and occupy a relatively small area for its voltage rating. In an embodiment, a relative thin and relative highly doped channel region can help to achieve a relatively low pinch-off voltage, a relatively high output resistance, and relatively high drain saturation current. A drift region can be used with field electrodes that provides a relatively high breakdown voltage. In another embodiment, a doped region that connects the channel region with the drift region can be along a conduction path having relatively sharp bends. In a further embodiment, the JFET can be formed using a CMOS process flow. In another embodiment, a multi-stripe design of the conduction channels can make use of lateral and vertical pinch off to achieve a tunable or an even lower pinch-off voltage.

In an aspect, an electronic device can include a JFET. The JFET can include a drain contact region having a first conductivity type; a channel region spaced apart from the drain contact region and having the first conductivity type; and a gate region adjacent the channel region and having a second conductivity type opposite the first conductivity type. The gate region can include a first portion and a second portion, wherein the second portion is disposed between the first portion and the drain contact region, and the second portion has a lower dopant concentration as compared to the first portion.

In another aspect, an electronic device can include a JFET. The JFET can include a channel region having a first conductivity type, and a gate having a second conductivity type opposite the first conductivity type. In the width direction, the gate can surround the channel region.

In a further aspect, a process of forming an electronic device including a JFET can include forming a first portion of a gate region within a semiconductor layer, wherein the first portion of the gate region has a first conductivity type; forming a second portion of the gate region within the semiconductor layer, wherein the second portion has the first conductivity type; and forming a drain contact region within the semiconductor and having a second conductivity type opposite the first conductivity type. In a finished device, the second portion of the gate region can be disposed between the first portion of the gate region and the drain contact region, the second portion can have a lower dopant concentration as compared to the first portion, a channel region of the JFET can have a second conductivity type opposite the first conductivity type, and each of the channel region and the gate region can be spaced apart from the drain contact region.

In the description below, a first set of embodiments is described. A first part of the description of the first set of embodiments will focus more on doped regions, dopant concentrations, and depths of the doped regions and on structures and depths of the structures. A second part of the description of the first set of embodiments will focus more on lateral offsets between doped regions and other doped regions or structures. A process flow that can be used with the first set of embodiments is described. Other alternative sets of embodiments are described after the exemplary process flow.

FIG. 1 includes a cross-sectional view of a portion of a workpiece that includes a JFET 100. FIG. 1 includes half of the JFET 100; the other half is a mirror image of what is illustrated in FIG. 1. In describing the JFET 100, a substrate 102, an n-type buried doped region 104, a semiconductor layer 106, and an n-type resurf region 430 are described before the remaining features of the JFET 100. In general, the remaining features of the JFET 100 will be described starting with the features closer to the left-hand side of FIG. 1 and proceeding to the right-hand side of FIG. 1.

The substrate 102 can be a base material or a layer overlying a base material. In an embodiment, the substrate 102 can be a heavily doped semiconductor wafer. In a particular embodiment, the substrate 102 is a heavily doped p-type Si wafer.

Figure 2:
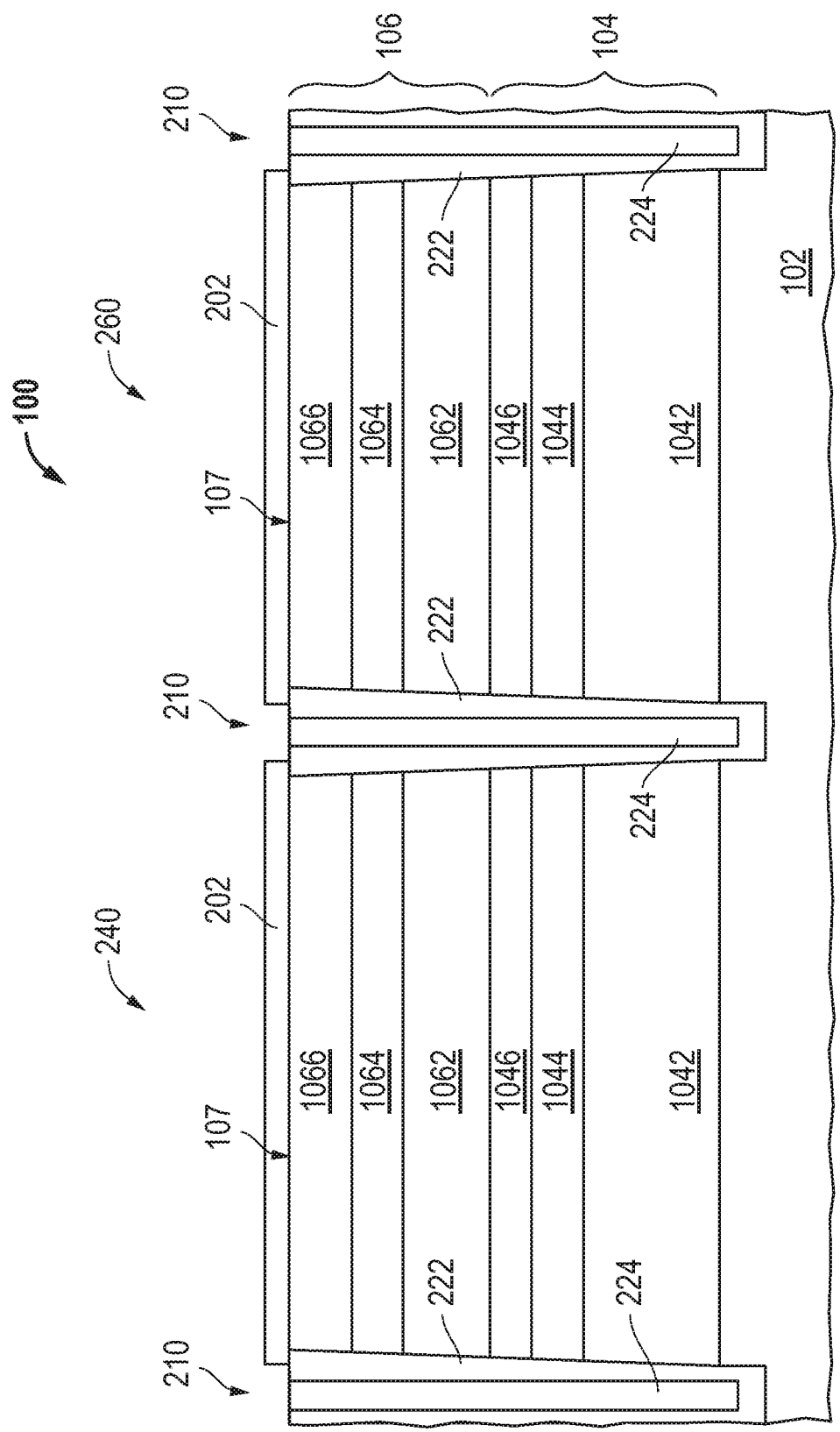
FIG. 2 includes an illustration of a cross-sectional view of a larger portion of the electronic device after forming a buried doped region, a semiconductor layer, and a field isolation structure, wherein such larger portion includes areas where the high-voltage JFET and other electronic components can be formed.

The n-type buried doped region 104 overlies and has the opposite conductivity type as compared to the substrate 102. The buried doped region 104 can be n-type doped. In accordance with an embodiment, the buried doped region 104 in the finished device is configured to be electrically floating (e.g., no external connection is made to the buried doped region 104). FIG. 2 includes more details regarding the buried doped region 104. The details are not illustrated in FIG. 1 to simplify understanding the features of the JFET 100 formed within or through the semiconductor layer 106. Referring to FIG. 2, the buried doped region 104 can include a plurality of portions of different dopant concentrations. In an embodiment, portion 1044 can be more heavily doped as compared to the portions 1042 and 1046. The dopant concentrations within the portions 1042 and 1046 can be lower than the portion 1044 to help with junction breakdown voltages between the substrate 102 and the buried doped region 104 and between the buried doped region 104 and the semiconductor layer 106.

By way of example, the portion 1042 can have an average dopant concentration in a range from $1 \times 10^{15}$ atoms/cm$^3$ to $1 \times 10^{17}$ atoms/cm$^3$ and a thickness in a range from 1 micron to 5 microns, the portion 1044 can have an average dopant concentration in a range from $2 \times 10^{17}$ atoms/cm$^3$ to $1.0 \times 10^{19}$ atoms/cm$^3$ and a thickness in a range from 1 micron to 3 microns, the portion 1046 can have an average dopant concentration in a range from $1.0 \times 10^{15}$ atoms/cm$^3$ to $1.0 \times 10^{17}$ atoms/cm$^3$ and a thickness in a range from 1 micron to 4 microns. The dopant concentrations and thicknesses of the portions 1042, 1044, and 1046 can be different from the values previously described. For example, the thickness of the portion 1042 can be made thicker to further reduce leakage current. The thicknesses of the portions 1042 and 1046 can be thinner or thicker depending on the voltage rating of the JFET 100. In another further embodiment, the buried doped region 104 can have a substantially constant dopant concentration.

The semiconductor layer 106 overlies and has the same conductivity type as compared to the substrate 102. In a particular embodiment, the semiconductor layer 106 is a p-type epitaxial layer. FIG. 2 includes more details regarding the semiconductor layer 106. The details are not illustrated in FIG. 1 to simplify understanding the features of the JFET 100 formed within or through the semiconductor layer 106. Referring to FIG. 2, the top surface of the semiconductor layer 106 as originally formed is the major surface 107. The semiconductor layer 106 can include a plurality of portions of different dopant concentrations. In an embodiment, portion 1064 can be more heavily doped as compared to the portions 1062 and 1066.

By way of example, the portion 1062 can have an average dopant concentration in a range from $5 \times 10^{14}$ atoms/cm$^3$ to $1 \times 10^{16}$ atoms/cm$^3$ and a thickness in a range from 1 microns to 5 microns, the portion 1064 can have an average dopant concentration in a range from $5 \times 10^{16}$ atoms/cm$^3$ to $1.0 \times 10^{18}$ atoms/cm$^3$ and a thickness in a range from 1 micron to 3 microns, the portion 1066 can have an average dopant concentration in a range from $5.0 \times 10^{14}$ atoms/cm$^3$ to $1.0 \times 10^{16}$ atoms/cm$^3$ and a thickness in a range from 2 microns to 9 microns. The dopant concentration within the portion 1066 is referred to herein as the background concentration. The dopant concentrations and thicknesses of the portions 1062, 1064, and 1066 can be different from the values previously described. For example, the thickness of the portion 1066 can be made thinner for a JFET having a lower voltage rating. In another embodiment, the semiconductor layer 106 can have a substantially constant dopant concentration that is the same as previously described for the portion 1066.

Referring to FIG. 1, the n-type resurf region 430 is within the semiconductor layer 106. In an embodiment, the n-type resurf region 430 is within the portion 1066 (FIG. 2) of the semiconductor layer 106 and overlies the portion 1064 (FIG.

2) of the semiconductor layer 106. In another embodiment, the n-type resurf region 430 is spaced apart from the major surface 107 by a distance in a range from 1 micron to 4 microns. In the embodiment as illustrated in FIG. 2, laterally, the n-type resurf region 430 does not extend to doped region along a side of the field isolation region 210 and does not underlie a drain contact region 864. The lateral offset of the n-type resurf region 430 on the drain side of the JFET 100 helps to improve drain-to-gate breakdown voltage. In an embodiment, the n-type resurf region 430 has a thickness in a range from 2 microns to 5 microns. In another embodiment, the n-type resurf region 430 has a dopant concentration in a range from $5.0 \times 10^{15}$ atoms/cm$^3$ to $2.0 \times 10^{17}$ atoms/cm$^3$.

Referring to the left-hand side of FIG. 1, a field isolation structure 210 can be a deep trench isolation structure. The field isolation structure 210 can be used to isolate the JFET 100 from other components of the electronic device. Referring to FIG. 2, an active region 240 may be where the JFET 100 will be formed, and an active region 260 may be where other power components, digital logic transistors, or other components will be formed. Thus, the active regions 240 and 260 lie along opposite sides of the portion of the field isolation region 210 near the center of FIG. 2. As illustrated in FIG. 2, the field isolation structure 210 extends from the major surface 107 through the semiconductor layer 106 and buried doped region 104 and terminates within the substrate 102. Thus, different portions of the buried doped region 104 are electrically isolated from each other by the field isolation structure 210. In an embodiment, the electronic device can include a single field isolation structure, and in another embodiment, the electronic device can include a plurality of field isolation structures 210. To simplify understanding of the electronic device and its formation, the description below refers to the field isolation structure 210 in the singular. Skilled artisans will appreciate that in other embodiments, more than one field isolation structure 210 may be used.

A set of doped regions are along the sides of the field isolation structure 210. The doped regions from the shallowest to the deepest include a p-type doped region 622, a p-type resurf region 624, and a p-type field region 626. The p-type doped region 622 can be formed at the same time as a p-type doped region 620 that includes at least a part of the channel region of the JFET 100 and p-type doped region 628 that is adjacent to a drain contact region 864. More details regarding the depth and dopant concentration of the p-type doped regions 620, 622, and 628 are described later in this specification with respect to the p-type doped region 620.

The p-type resurf region 624 can be formed at the same time as another p-type resurf region within the electronic device. Such other p-type resurf can be within a high voltage n-channel field-effect transistor. More details regarding the depth and dopant concentration of the p-type resurf region 624 are described later in this specification with respect to a doped region 530.

The p-type field region 626 can help to control the electrical fields adjacent to the field isolation structures 210 deeper into the workpiece as compared to the p-type doped regions 622 and 624 without the p-type field region 626. The p-type field region 626 can be spaced apart by a distance from the n-type buried doped region 104. The distance may be affected by the voltage rating of the JFET 100. In a particular embodiment, the distance is in a range from 6 microns to 12 microns. In an embodiment, the p-type field region 626 is within the portion 1066 and overlies the portion 1064 of the semiconductor layer 106. In another embodiment, the p-type field region 626 has a dopant concentration in a range from $1.0 \times 10^{16}$ atoms/cm$^3$ to $5.0 \times 10^{17}$ atoms/cm$^3$.

FIG. 1 also includes field isolation structures 510. In an embodiment, the field isolation structures 510 can help to electrically isolate different doped regions along the major surface 107. The field isolation structures 510 can be shallow trench isolation structures. The field isolation structures 510 can have a depth in a range from 0.20 micron to 0.90 micron, as measured from the major surface 107. The field isolation region 510 can include one or more films of an oxide, a nitride, or an oxynitride.

FIG. 1 further includes n-well regions 730 and 732. The n-well region 732 helps to connect a gate contact region 872 to the n-type resurf region 430, and therefore, the n-well region 732 is a connection region. The n-well region 730 is part of a bottom gate region for the JFET 100. Another n-well region (not illustrated in FIG. 1) can be formed in a digital logic portion of the electronic device that is described later in this specification. In an embodiment, the n-well regions 730 and 732 can have a depth in a range from 1 micron to 3 microns, as measured from the major surface 107. In another embodiment, the n-well regions 730 and 732 can have a dopant concentration in a range from $5.0 \times 10^{15}$ atoms/cm$^3$ to $5.0 \times 10^{17}$ atoms/cm$^3$.

FIG. 1 further includes the gate contact region 872 that is n-type doped. The gate contact region 872 allows ohmic contacts to be made to overlying metal or metal alloy interconnects that are part of or electrically connected to a gate terminal 914. The combination of the gate contact region 874 and n-well region 732 provide a conduction path that allows the bottom gate region of the JFET 100 to be biased from the gate terminal 914. The function and design considerations for the principal top gate region 874 are described later in this specification. In an embodiment, the gate contact region 872 can extend from the major surface 107 and have a depth in a range from 0.050 micron to 0.90 micron. In another embodiment, the gate contact region 872 can have a dopant concentration of at least $1 \times 10^{19}$ atoms/cm$^3$.

The p-type doped region 620 is at least part of the channel region that is between the top and bottom gate regions of the JFET 100. As illustrated in FIG. 1, the p-type doped region 620 underlies a source contact region 862 and may extend below the field isolation structures 510. The left-hand portion of the p-type doped region 620 (under the source contact region 862) can help reduce $R_{DSON}$. In an embodiment, the p-doped regions 620, 622, and 628 can have a depth in a range from 0.3 micron to 1.2 microns, as measured from the major surface 107. The thickness of the p-type doped region 620 between the gate regions of the JFET can be in a range from 0.1 micron to 0.8 microns. In another embodiment, the p-doped regions 620, 622, and 628 can have a dopant concentration in a range from $2.0 \times 10^{16}$ atoms/cm$^3$ to $5.0 \times 10^{17}$ atoms/cm$^3$.

FIG. 1 further includes p-well regions 720, 722, and 724. The p-well region 720 helps to reduce $R_{DSON}$, as compared to the semiconductor layer 106 that has the background dopant concentration. The function and further design considerations for the p-well regions 722 and 724 are described later in this specification. Within the JFET 100, the p-well regions 720 and 722 are illustrated as extending to the n-type resurf region 430. The p-well regions 720 and 722 have depths that extend at least 50% of the distance between from the major surface 107 and the n-type resurf region 430. Another p-well region (not illustrated in FIG. 1) can be formed in a digital logic portion of the electronic device and is described later in this specification. In an embodiment, the p-well regions 720, 722, and 724 can have a depth in a range from 0.8 micron to 2.0 microns, as measured from the major surface 107. In another embodiment, the p-well regions 720, 722, and 724 can have a dopant concentration in a range from $1.0 \times 10^{16}$ atoms/cm$^3$ to $4.0 \times 10^{17}$ atoms/cm$^3$.

The source contact region 862 and the drain contact region 864 are p-type doped. The contact regions 862 and 864 allow ohmic contacts to be made to overlying metal or metal alloy interconnects that are part of or electrically connected to a source terminal 916 and a drain terminal 912. In an embodiment, the contact regions 862 and 864 have a depth in a range from 0.050 micron to 0.90 micron. In another embodiment, the contact regions 862 and 864 can have a dopant concentration of at least $1 \times 10^{19}$ atoms/cm$^3$.

The principal top gate region 874 is at least part of the top gate region. In an embodiment of FIG. 1, the principal top gate region 874 is part, and not all, of the top gate region. In another embodiment that is described later, the principal top gate region 874 is the top gate region. The principal top gate region 874 has a dopant concentration that allows an ohmic contact to be made to overlying metal or metal alloy interconnects that are part of or electrically connected to the gate terminal 914. In an embodiment, the principal top gate region 874 can extend from the major surface 107 and have a depth in a range from 0.050 micron to 0.90 micron. In another embodiment, the principal top gate region 874 can have a dopant concentration of at least $1 \times 10^{19}$ atoms/cm$^3$.

The n-type doped region 530 can be part of the bottom gate region of the JFET 100 and, in conjunction with the n-well region 730, provides a dopant concentration grading within the bottom gate region of the JFET 100. With respect to the depth, in an embodiment, the n-type doped region 530 extends to the n-type resurf region 430 to ensure an electrical connection between the n-type resurf region 430 and the n-well region 730. In a further embodiment, the n-well region 730 may extend to the n-type resurf region 430, and thus, the n-type doped region 530 may not extend to the n-type resurf region 430. In an embodiment, the n-type doped region 530 can extend to a depth in a range of 1.5 microns to 3.5 microns, as measured from the major surface 107. In an embodiment, the distance between the n-type doped region 530 and the major surface 107 is in a range from 0.5 micron to 1.5 microns. In a further embodiment, the n-type doped region 530 has a dopant concentration in a range from $1 \times 10^{15}$ atoms/cm$^3$ to $1 \times 10^{17}$ atoms/cm$^3$.

An n-type extension region 852 is formed between the principal top gate region 874 and one of the field isolation structures 510. Similar to the combination of the n-well region 730 and n-type doped region 530 for the bottom gate region, the combination of the principal top gate region 874 and the n-type extension region 852 allows for a lateral concentration grading along the top gate region. As will be discussed later in this specification, the n-type extension region 852 is not required in all embodiments. In an embodiment, the n-type extension region 852 can extend from the major surface 107 and have a depth in a range from 0.050 micron to 0.90 micron. In another embodiment, the n-type extension region 852 can have a dopant concentration in a range from $1 \times 10^{17}$ atoms/cm$^3$ to $8 \times 10^{18}$ atoms/cm$^3$.

The p-well region 722 helps to form a continuous conduction path between the source and drain of the JFET 100 when the JFET 100 is in the on-state (for example, $V_{GS}$ at 0 V). In the embodiment as illustrated in FIG. 1, the p-well region 722 is disposed laterally between portions of the semiconductor layer 106 that have substantially the background dopant concentrations. Without the p-well region 722, a significant risk of too much counter doping of the semiconductor layer 106 adjacent to the right of the p-type doped region 620 may occur. The portions of the semiconductor layer 106 adjacent to the p-well region 722 help to keep the junction breakdown voltage through avalanche sufficiently high and keep the area of the JFET 100 relatively small.

The p-type drift region 640 can help to control the electrical field between the drain contact region 864 and portions of the conduction path to the left of the p-type drift region 640. The p-type drift region 640 can extend at least to the n-type resurf region 430. In an embodiment, the p-type drift region 640 can have a depth in a range from 0.8 micron to 2.2 microns, as measured from the bottom of the field isolation region 510. In another embodiment, the p-type drift region 640 can have a dopant concentration in a range from $7 \times 10^{15}$ atoms/cm$^3$ to $2 \times 10^{17}$ atoms/cm$^3$.

Referring to the right-hand portion of FIG. 1, the JFET 100 includes the drain contact region 864, the p-type doped region 628, and the p-well region 724. The p-type doped region 628 and the p-well region 724 help to provide vertical grading of the p-type doping to help keep the drain-to-substrate breakdown voltage sufficiently high which achieving low $R_{DSON}$ and a reasonably good safe operating area that avoids a condition where both the voltage and current are simultaneously too high and potentially results in the JFET 100 becoming destroyed or degraded. Depths and dopant concentrations for the drain contact region 864, the p-type doped region 628, and the p-well region 724 are described earlier in this specification.

In the embodiment of the JFET 100 as illustrated in FIG. 1, a gate field electrode 892 and a drain field electrode 894 overlies the field isolation structure 510 between the top gate region of the JFET 100 and the drain contact region 864. The field electrodes 892 and 894 affect electrical fields within the JFET 100.

The source terminal 916 is coupled to the source contact region 862, the gate terminal 914 is coupled to the gate contact region 872, the principal top gate region 874, and the gate field electrode 892, and the drain terminal 912 is coupled to the drain contact region 864 and the drain field electrode 894. In an embodiment, the previously described couplings can be in the form of electrical connections. In particular, the source terminal 916 and the source contract region 872 can be electrically connected to each other at a node, the gate terminal 914, the gate contact region 872, the principal top gate region 874, and the gate field electrode 892 can be electrically connected to one another at another node, and a drain terminal 912, the drain contact region 864, and the drain field electrode 894 can be electrically connected to one another at a further node.

In the preceding description of the JFET 100, more of the focus is on depths and dopant concentrations of doped regions, as compared to lateral directions. This portion of the specification addresses some of the lateral offsets between regions, between structures and regions, and design considerations regarding such lateral offsets.

Before addressing the lateral offsets, the relative dopant concentrations between different layers and doped region may help in understanding some of the lateral offsets. Table 1 includes layers and regions with p-type dopants from the lowest dopant concentration to the highest, and Table 2 includes layers and regions with n-type dopants from the lowest dopant concentration to the highest. In other embodiments, the order of some of the doped regions can be different from what is described below.

TABLE 1

P-type doped layers and regions, from lowest to highest concentration.

| | |
|---|---|
| Increasing Conc. ↓ | Portions 1062 and 1066 of the semiconductor layer 106 |
| | P-type resurf region 624 |
| | P-type drift region 640 |
| | Portion 1064 of the semiconductor layer 106 |
| | P-well regions 720, 722, and 724 |
| | P-type field region 626 |
| | P-type doped regions 620, 622, and 628 |
| | Source and drain contact regions 862 and 864 |
| | Substrate 102 |

TABLE 2

N-type doped layers and regions, from lowest to highest concentration.

| | |
|---|---|
| Increasing Conc. ↓ | Portions 1042 and 1046 of the semiconductor layer 104 |
| | N-type doped region 530 |
| | N-type resurf region 430 |
| | N-well regions 730 and 732 |
| | Portion 1044 of the semiconductor layer 104 |
| | N-type extension region 852 |
| | Gate contact region 872 and principal top gate region 874 |

Regarding the bottom gate region, the n-type doped region 530 extends laterally beyond the relatively more heavily doped n-well region 730. Toward the drain side of the JFET 100, the lateral offset between the n-type doped region 530 and the n-well region 730 can help to reduce the likelihood that the channel of the JFET 100 closes up due to the reduced p-type dopant concentration between the p-type doped region 620 and the p-well region 722. In an embodiment, the n-type doped region 530 extends beyond the n-well region 730 toward the drain contact region 864 for a lateral distance in a range from 0.05 micron to 0.5 micron.

Toward the source side of the JFET 100, the lateral offset between the n-type doped region 530 and the n-well region 730 can aid conduction between the source contact region 862 and the p-type doped region 620. In an embodiment, the n-type doped region 530 extends beyond the n-well region 730 toward the source contact region 862 for a lateral distance in a range from 0.05 micron to 2.0 microns. In another embodiment, the n-type doped region 530 may laterally extend such that it is under the source contact region 862. In a further embodiment, the n-type doped region 530 does not extend beyond the n-well region 730 toward the source contact region 862, and in a particular embodiment, the n-well region 730 extends beyond the n-type doped region 530 toward the source contact region 862. In another embodiment, the n-type doped region 530 does not need to extend beyond the n-well region 730 toward the source contact region 862.

The top gate region may have a dopant concentration that is tapered toward the drain contact region 864 similar to the bottom gate region for the same reason as the bottom gate region. In the embodiment as illustrated in FIG. 1, the top gate region includes the principal top gate region 874 and the n-type extension region 852. One of the field isolation regions 510 is disposed between the top gate region and the drain contact region 864. In an embodiment, the principal top gate region 874 can be laterally offset from such field isolation region 510 in a range of 0.05 micron to 2.0 microns. In another embodiment (described later in this specification), the n-type extension region 852 may not be present. However, the principal top gate region 874 may still laterally spaced apart from the field isolation structure 510 by a distance as previously described.

Part of the semiconductor layer 106 is disposed between the p-type doped region 620 and the p-well region 722. This part of the semiconductor layer 106 helps to keep the breakdown voltage relatively high without significantly affecting $R_{DSON}$ of the JFET 100. In an embodiment, the length of the part of the semiconductor layer 106 (lateral distance between the p-type doped region 620 and the p-well region 722) is in a range from 0 micron to 1.0 micron.

The p-well region 722 can help with the conduction near the field isolation structures 510 closest to the drain contact region 864. With respect to the source-side edge of the field isolation structure 510, the p-well region 722 extend toward each of the source side and the drain side of the JFET 100.

Another portion of the semiconductor layer 106 is disposed between the p-well region 722 and the p-type drift region 640. Such portion of the semiconductor layer 106 has the background dopant concentration. The lateral distance between the p-well region 722 and the p-type drift region 640 should be large enough to help with improving the breakdown voltage and output impedance but not so large to cause $R_{DSON}$ to be unacceptably high. In an embodiment, the length of the portion of the semiconductor layer 106 (lateral distance between the p-well region 722 and the p-type drift region 640) is in a range from 0.5 micron to 3.0 microns. The previously described offset may be used for a JFET having a voltage rating of 50 V to 100 V. After reading the specification in its entirety, skilled artisans will understand that the length of the portion of the semiconductor layer 106 may be different as the voltage rating of the JFET 100 changes.

Along the right-hand side of FIG. 1, the dopant concentration starting at the drain contact region 864 is tapered in a vertical direction to keep the drain-to-gate breakdown voltage sufficiently high. In particular, the drain contact region 864 overlies the p-type doped region 628 that overlies the p-well region 724 that overlies a portion of the p-type drift region 640 that overlies a portion of the semiconductor layer 106. The n-type resurf region 430 is laterally offset from the vertically-oriented p-type doped regions. The lateral offset allows a sufficiently high drain-to-gate breakdown voltage. In an embodiment, the lateral offset of the n-type resurf region 530 from the center of the drain contact region 864 is in a range of 0.5 micron to 4 microns. The previously described offset may be used for a JFET having a voltage rating of 50 V to 100 V. After reading the specification in its entirety, skilled artisans will understand that the length of the portion of the semiconductor layer 106 may be different as the voltage rating of the JFET 100 changes.

Attention is now directed to a process of forming the electronic device. Many details are provided. In the general process sequence described below, semiconductor layers are formed, followed by the field isolation structure 210, followed by doping for some regions for high-voltage components that include the JFET 100, followed by the field isolation structures 510, followed by doping for other regions for high-voltage components, and followed by regions and features for the high-voltage components that are formed at the same time as regions and features for low-voltage components of the electronic device. The order described herein may be changed. For example, all of doping that is unique to the high-voltage components may be performed before any of the field isolation structures 510 are formed. In another embodiment, the formation of the n-type resurf region 430 may occur after forming the part, and not all, of the semiconductor layer 106. After reading the specification in its entirety, skilled artisans will be able to determine a particular process sequent that meets the needs or desires for a particular application. FIG. 1 should be referenced frequently during the description of the process sequence for a better understanding of the relationship between the formation of regions and features that are part of the JFET and other parts of the electronic device.

FIG. 2 illustrates a portion of the workpiece 100 that includes substrate 102 after forming the buried doped region 104, the semiconductor layer 106, a sacrificial layer 202 and the field isolation structure 210. The top major surface 107 is at the upper surface of the semiconductor layer 106 as originally formed.

In an embodiment, the buried doped region 104 can be formed over all of the workpiece 100. In another embodiment, the buried doped region 104 may be selectively formed. For example, the buried doped region 104 may not underlie an n-channel IGFET, so that the body of the n-channel IGFET may be biased using the substrate 102.

In the previously described embodiment, the buried doped region 104 has a substantially discretely graded dopant profile. The dopant concentrations can be changed during epitaxially growth to form the portions 1042, 1044, and 1046. Alternatively, the portion 1044 can be formed by doping after the buried doped region 104 is grown. For example, the buried doped region 104 can be grown, and the portion 1044 can be formed by ion implantation, and the portions 1042 and 1046 can be formed by diffusing dopant from the portion 1044.

In the previously described embodiment, the semiconductor layer 106 has a substantially discretely graded dopant profile. The dopant concentrations can be changed during epitaxially growth to form the portions 1062, 1064, and 1066. Alternatively, the portion 1064 can be formed by doping after the semiconductor layer 106 is grown. For example, the semiconductor layer 106 can be grown, and the portion 1064 can be formed by ion implantation, and the portions 1062 and 1066 can be formed by diffusing dopant from the portion 1064.

The sacrificial layer 202 can be formed to aid in the formation of the field isolation structure 210. The sacrificial layer 202 can act as an etch-stop or polish-stop layer. The sacrificial layer can include one or more films of material different from the semiconductor material of the buried doped region 104, the semiconductor layer 106, and any materials formed within trenches of the field isolation structure 210. In an embodiment, the sacrificial layer 202 can include an oxide film formed along the major surface 107 and a nitride film formed over the oxide film. The oxide film may be thermally grown from the semiconductor layer 106 or deposited, and the nitride film is deposited. The sacrificial layer 202 has a thickness in a range of 50 nm to 500 nm. The sacrificial layer 202 can be patterned to define an opening that exposes the semiconductor layer 106.

The portions of the workpiece under the opening are etched to define a trench for the field isolation structure 210. In the embodiment illustrated in FIG. 2, after defining the trench for the field isolation structure 210, an insulating layer 222 can be formed along exposed surfaces of the trench, and a fill material 224 can be used to fill a remainder of the trench. The insulating layer 222 can include an oxide, a nitride, or an oxynitride and be formed by thermal growth, a deposition, or by a thermal growth followed by a deposition. The fill material 224 can help to reduce stress. The fill material 224 can include polycrystalline or amorphous Si, and the substrate 102, buried doped region 104, and semiconductor layer 106 can include monocrystalline Si. In another embodiment, the fill material 224 may not be used, and trench may only include the insulating layer 222.

At this point in the process, the field isolation structures 510 and doping for high-voltage components can be formed. In an embodiment, dopants for the high-voltage components can be implanted before, during, or after the field isolation structures are formed. For example, the n-type resurf region 430 can be formed after patterning the semiconductor layer 106 to define trenches for field isolation structures 510 and before forming an oxide liner layer within the trenches. The n-type doped regions 530 can be formed by implanting the same portions of the JFET 100 with an n-type drift region implant and a p-type resurf region implant. In other areas of the electronic device, the n-type drift region implant and the p-type resurf region may be implanted into different regions to form a n-type drift region and p-type resurf regions, such as for a high-voltage n-channel LDMOS transistor. In FIG. 1, the p-type resurf region 624 is part of the field doping adjacent to the field isolation structure 510, and another p-type resurf region (not illustrated) is formed within the electronic device and outside the JFET 100. The oxide liner within the trenches of the field isolation structures 510 allow the oxide liner to be an implant screen to reduce the effect of implant channeling, such as when implanting $B^+$ into the semiconductor layer 106.

The formation of the field isolation structures 510 can be completed and other implants for the high-voltage components can be performed. These can include implants for the p-type drift region 640, the p-type field region 626, and the p-type regions 620, 622, and 628. The order for the implants of these regions is not critical and can be changed if needed or desired.

Figure 3:
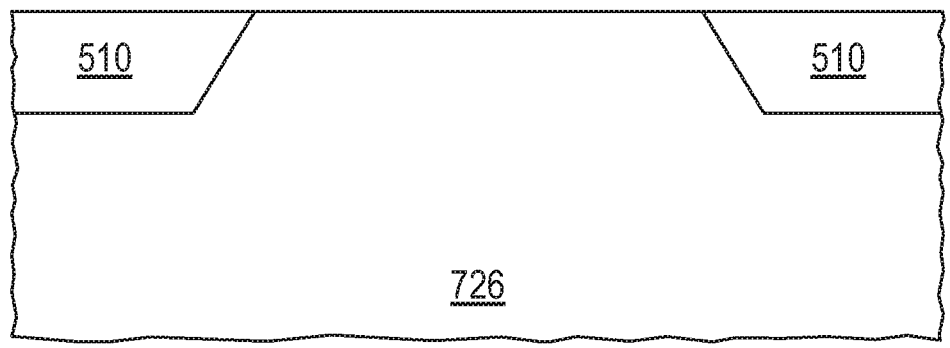
FIG. 3 includes an illustration of a cross-sectional view of a portion of the electronic device after forming a p-well region spaced apart from the JFET.
Figure 4:
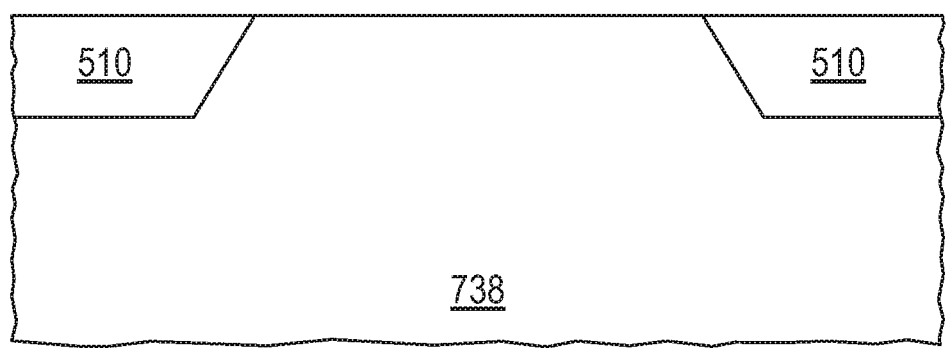
FIG. 4 includes an illustration of a cross-sectional view of a portion of the electronic device after forming an n-well region spaced apart from the JFET and the p-well region of FIG. 3.

At this point in the process, doped regions and features that have corresponding doped regions and features with low-voltage components, such as logic transistors, at other locations within the electronic device can be formed with corresponding doped regions and structures in the JFET 100. FIGS. 3 and 4 include illustrations of portions of the workpiece after forming a p-well region 726 and an n-well region 738 in areas where n-channel and p-channel IGETs are being formed. Such n-channel and p-channel IGFETs may provide logic for turning on and off the JFET 100 or provide other logic operations within the electronic device. In an embodiment, n-well regions 730, 732, and 738 can be formed during the same implantation. In another embodiment, the p-well regions 720, 722, 724, and 726 can be formed during the same implantation. The scale of FIGS. 3 and 4 is substantially enlarged as compared to FIG. 1, and thus, the substrate 102, the buried doped region 104, and the semiconductor layer 106 may underlie the p-well region 726 and the n-well region 738 but are not illustrated in FIGS. 3 to 8.

Figure 5:
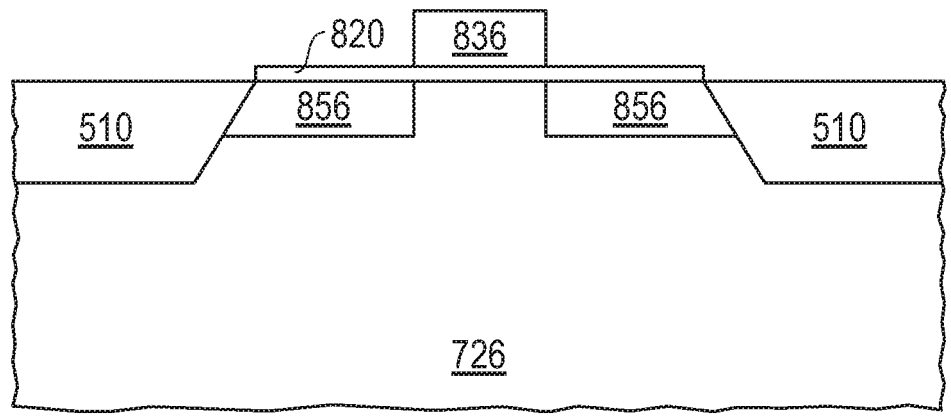
FIGS. 5 and 6 include illustrations of cross-sectional views of the portions of FIGS. 3 and 4, respectively, after forming a gate dielectric layer, gate electrodes, and lightly-doped drain regions.
Figure 6:
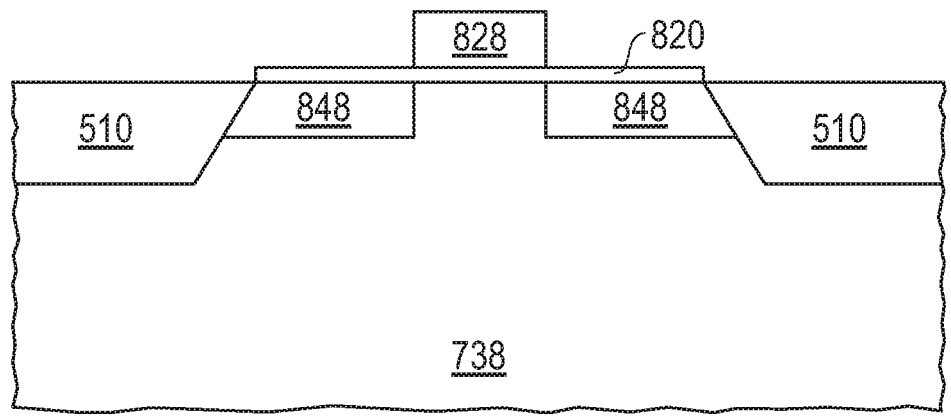

FIGS. 5 and 6 include illustrations of portions of the workpiece after forming a gate dielectric layer 820, gate electrodes 828 and 836, and lightly doped drain regions 848 and 856 in areas where n-channel and p-channel IGFETs are being formed. In the embodiment as illustrated, the gate dielectric layer 820 can be formed by thermally growing an oxide layer from exposed portions in the p-well region 726 and the n-well region 738. In another embodiment, the gate dielectric layer 820 can be formed by depositing one or more films including an oxide, a nitride, or an oxynitride. In a further embodiment, the gate dielectric layer 820 has a thickness in a range from 2 nm to 30 nm.

The gate electrode 828 for the p-channel transistor and the gate electrode 836 for the n-channel transistors are formed by depositing a conductive layer and patterning the conductive layer as illustrated in FIGS. 5 and 6. The conductive layer can include a semiconductor layer that may be doped in situ or subsequently doped after the layer is deposited. In another embodiment, the conductive layer can include a metal. In still another embodiment, the conductive layer can include a bottom film closer to the gate dielectric layer 820 that has a desired work function and a top film having a different composition that is used for bulk conduction. In an embodiment, the gate electrode 836 can include a heavily doped n-type semiconductor material, and the gate electrode 828 can include a heavily doped p-type semiconductor material. The gate electrode 836 can be formed at the same time as the field electrodes 892 and 894 of the JFET 100. The conductive layer can have a thickness in a range of 50 nm to 500 nm. Other thicknesses may be used if desired or needed for a particular application. The conductive layer is patterned to define the gate electrodes 828 and 836 and the field electrodes 892 and 894.

The lightly-doped drain regions 848 and 856 are formed within the well regions 738 and 726, respectively. Each of the lightly-doped drain regions 848 and 856 have a conductivity type that is opposite that of its corresponding well region, and thus, in an embodiment, the lightly-doped drain regions 848 are p-type doped, and the lightly-doped drain regions 856 are n-type doped. The lightly-doped drain regions 848 and 856 have dopant concentrations that are greater than the dopant concentration of their corresponding well regions. In an embodiment, the lightly-doped regions 848 and 856 have an average dopant concentration in a range of $5\times10^{16}$ atoms/cm$^3$ to $5\times10^{18}$ atoms/cm$^3$. The depths of the lightly-doped drain regions 848 and 856 can be in a range of approximately 0.02 micron to approximately 0.9 micron. The n-type lightly-doped drain regions 856 can be formed at the same time as the n-type extension region 852 of the JFET 100.

Figure 7:
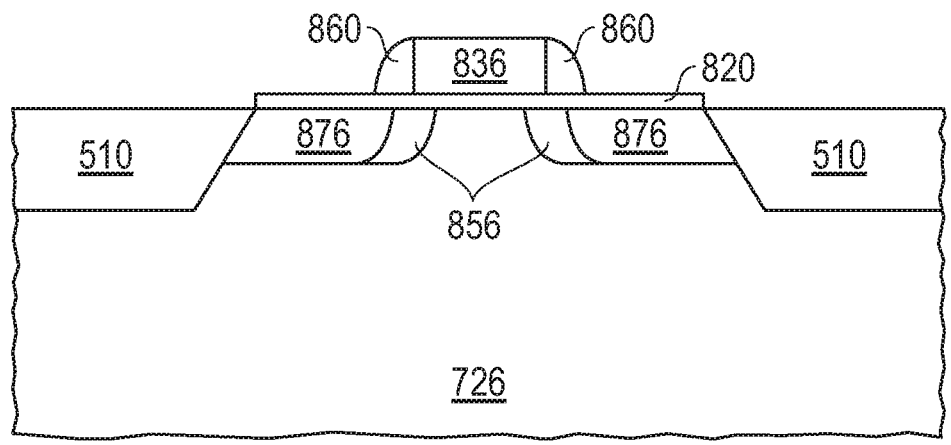
FIGS. 7 and 8 include illustrations of cross-sectional views of the portions of FIGS. 5 and 6, respectively, after forming sidewall spacers and heavily-doped drain/source regions.
Figure 8:
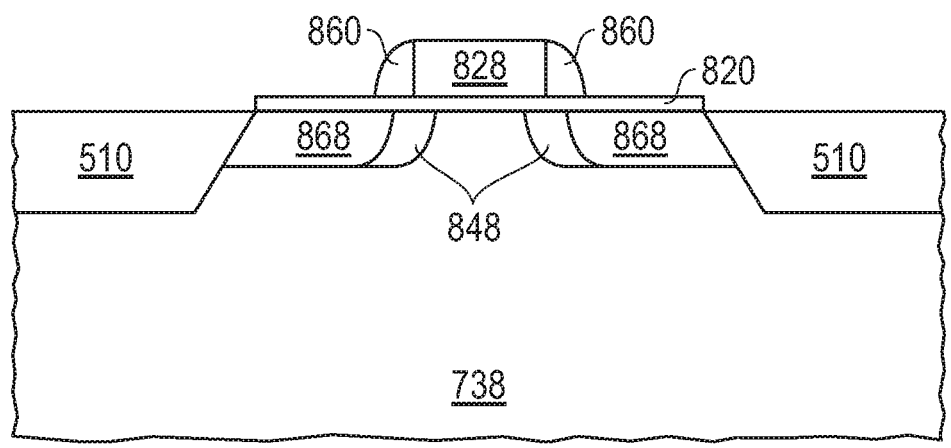

FIGS. 7 and 8 include illustrations of portions of the workpiece after forming sidewall spacers 860, and heavily-doped drain/source regions 868 and 876 in areas where n-channel and p-channel field-effect transistors are being formed. The rounding of the doped region profiles as illustrated in FIGS. 7 and 8 may occur after a subsequent thermal cycle that activates the dopants for regions 848, 856, 868, and 876

An insulating layer is deposited and etched to form sidewall spacers 860. The insulating layer can include an oxide, a nitride, an oxynitride and can be conformally deposited over the workpiece. The insulating layer can be anisotropically etched to leave the sidewall spacers 860 along sides of the gate electrodes 828 and 836. Although not illustrated in FIG. 1, sidewall spacers 860 are also formed along sides of the field electrodes 892 and 894.

In an embodiment, the drain/source regions 868 are p-type, and the drain/source regions 876 are n-type. In an embodiment, the heavily doped regions have an average dopant concentration of at least $1\times10^{19}$ atoms/cm$^3$ to allow ohmic contacts to be made to such regions. The depths of the heavily-doped regions can be in a range of approximately 0.02 micron to approximately 0.9 micron. The heavily doped regions that are n-type doped can be formed during one doping sequence, and the heavily doped regions that are p-type doped can be formed during another doping sequence. Although not illustrated, a p-type body contact region can be formed within the p-well region 726 at the same time as the drain/source electrodes 868, and an n-type body contact region can be formed within the n-well region 738 at the same time as the drain/source electrode 876. In an embodiment, the heavily-doped drain/source regions 876 can be formed at the same time as the gate contact region 872 and the principal top gate region 874 of the JFET 100. In another embodiment, the heavily-doped drain/source regions 868 can be formed at the same time as the source contact region 862 and the drain contact region 864 of the JFET 100.

An optional silicide formation can be performed to silicide portions of heavily doped regions and heavily doped semiconductor members. A silicide mask 880 can be formed over portions of the electronic device where a silicide compound is not to be formed. Such portions can include the doped regions along sides of the field isolation structure 210, the extension region 852 of the JFET 100, bodies of semiconductor resistors at other locations within the electronic device, and the like. A metal layer, such as Ti, Ta, Pt, W, or the like can be deposited over the workpiece. Portions of metal layer in contact with an underlying Si material can react and form a metal silicide. Unreacted portions of the metal layer can be removed, and the silicide mask 880 may be removed or remain. In an embodiment, at least portions of the source contact region 862, the gate contact region 872, the principal top gate region 874, the drain contact region 864, and the field electrodes 892 and 894 of the JFET 100 and drain/source regions 868 and 876 and gate electrodes 848 and 856 of the n-channel and p-channel IGFETs can be silicided.

Although not illustrated, one or more other interconnect levels and a passivation layer may be formed over the workpiece. Each interconnect level can include an interlevel dielectric (ILD) layer and interconnects. The ILD layer can include an oxide, a nitride, an oxynitride, or any combination thereof. The ILD layer can include a single film having a substantially constant or changing composition (e.g., a high phosphorus content further from the semiconductor layer 106) or a plurality of discrete films. An etch-stop film, an antireflective film, or a combination may be used within or over the ILD layer to help with processing. The ILD layer can be deposited to a thickness in a range of approximately 0.5 micron to approximately 2.0 microns. Portions of the ILD layer and the gate dielectric layer 820, where present, are patterned to define contact openings.

The conductive layer is deposited over the ILD layer and within the contact openings. The conductive layer can include a bulk conductive film that includes mostly Al or Cu. When the conductive layer includes a plurality of films, an adhesion film or a barrier film can be deposited before the bulk conductive film. An antireflective film can be formed over the bulk conductive film and can include a metal nitride film. The conductive layer can have a thickness in a range of 0.5 micron to 3 microns. The conductive layer can be patterned to form the interconnects. Terminal for the electronic device, including the terminals 912, 914, and 916 of the JFET 100, can be formed within the topmost conductive layer. The drain/source regions 868 and 878 and the gate electrodes 828 and 836 of the IGFETs can be coupled to other components within the electronic device or to the same other terminals of the electronic device.

The passivation layer can be formed over the topmost interconnect level and patterned to expose bond pads. The passivation layer can provide a barrier to external contaminants, such as moisture, mobile ions (e.g., Na$^+$ or K$^+$), or the like. The passivation can include one or more films of an oxide, a nitride, or an oxynitride. In an embodiment, the passivation layer can have a thickness in a range from 0.5 micron to 5 microns. If needed or desired, a patterned polyimide layer may be formed over the passivation layer.

Figure 9:
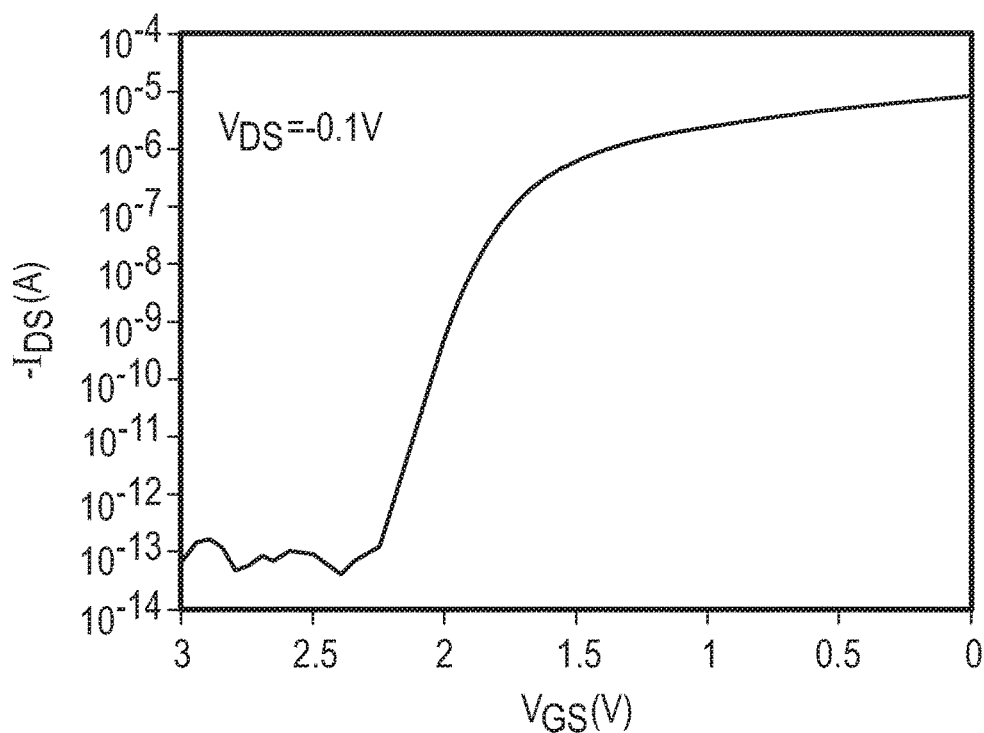
FIG. 9 includes a plot of drain current as a function of gate voltage for the JFET at a particular drain voltage.
Figure 10:
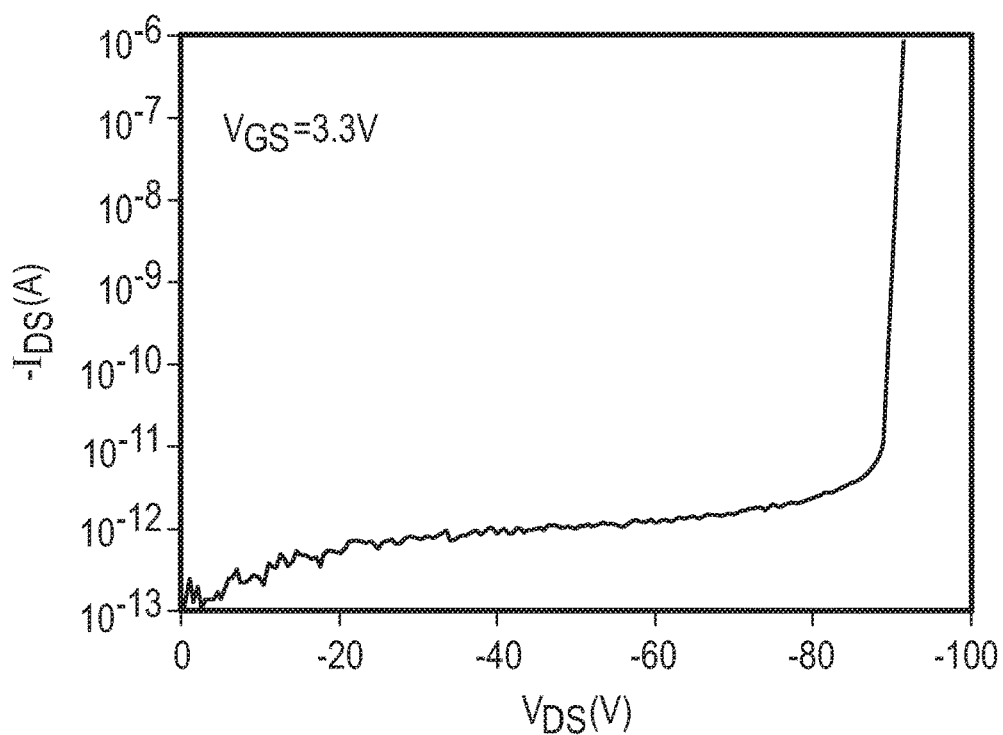
FIG. 10 includes a plot of drain current as a function of drain voltage for the JFET at a particular gate voltage.

The JFET 100 previously described has good electrical characteristics. In an embodiment, the JFET 100 has a voltage rating of 70 V. FIG. 9 includes a plot of drain current ($I_{DS}$) as function of gate voltage ($V_{GS}$) when the JFET 100 has a drain voltage ($V_{DS}$) of −0.1 V. The JFET 100 has a pinch-off voltage of approximately 2.0 V. FIG. 10 includes a plot of −$I_{DS}$ as a function of \hos when $V_{GS}$ is 3.3 V. The JFET 100 has a drain-to-source breakdown voltage ($B_{VDSS}$) of approximately −86 V. Thus, a JFET with a voltage rating of 70 V can be formed and have an acceptable $B_{VDSS}$ and a pinch-off voltage of approximately 2.0 V.

Figure 11:
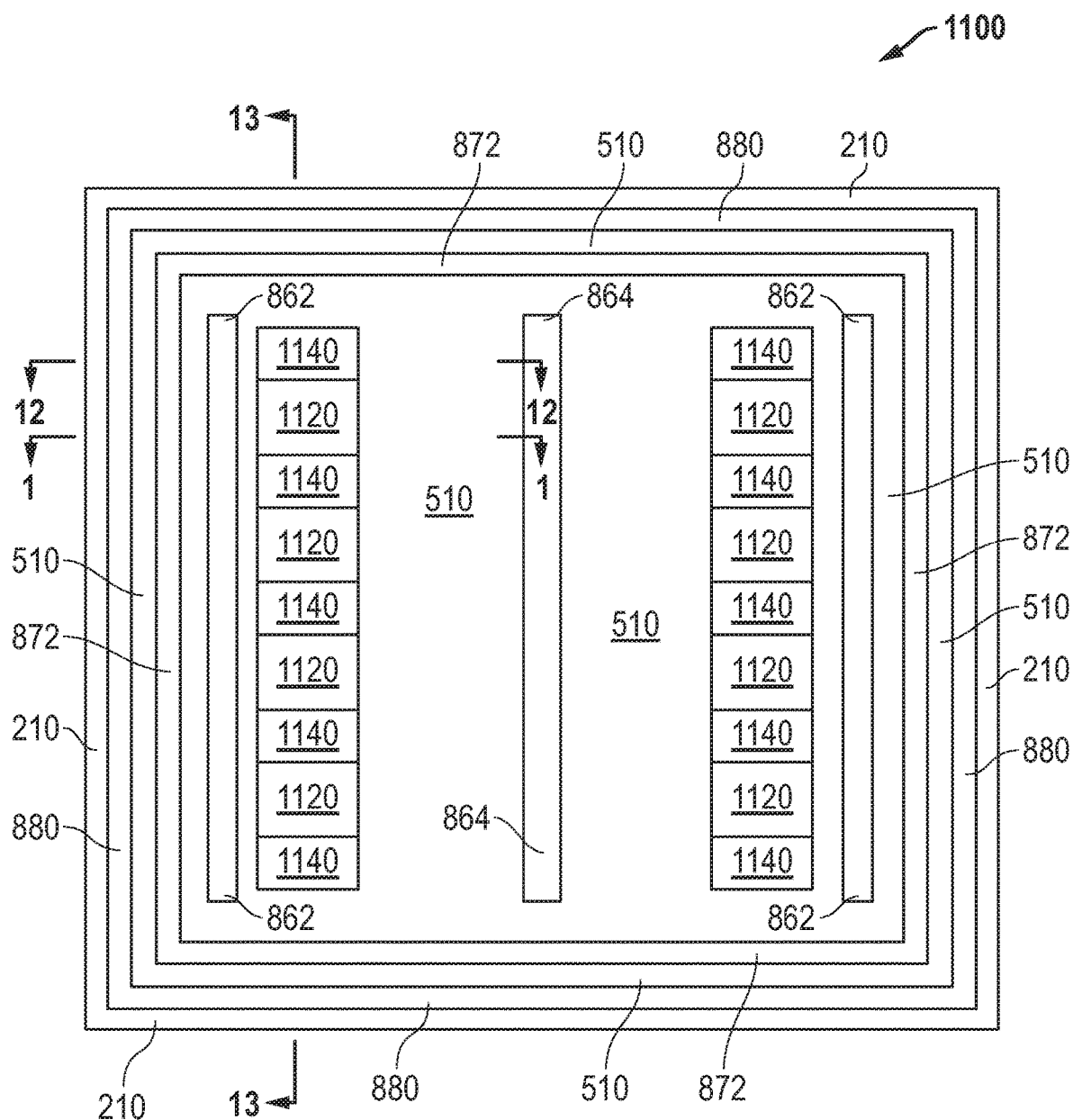
FIG. 11 includes an illustration of a top view of a portion of an electronic device that include a portion of a high-voltage JFET in accordance with an embodiment.
Figure 12:
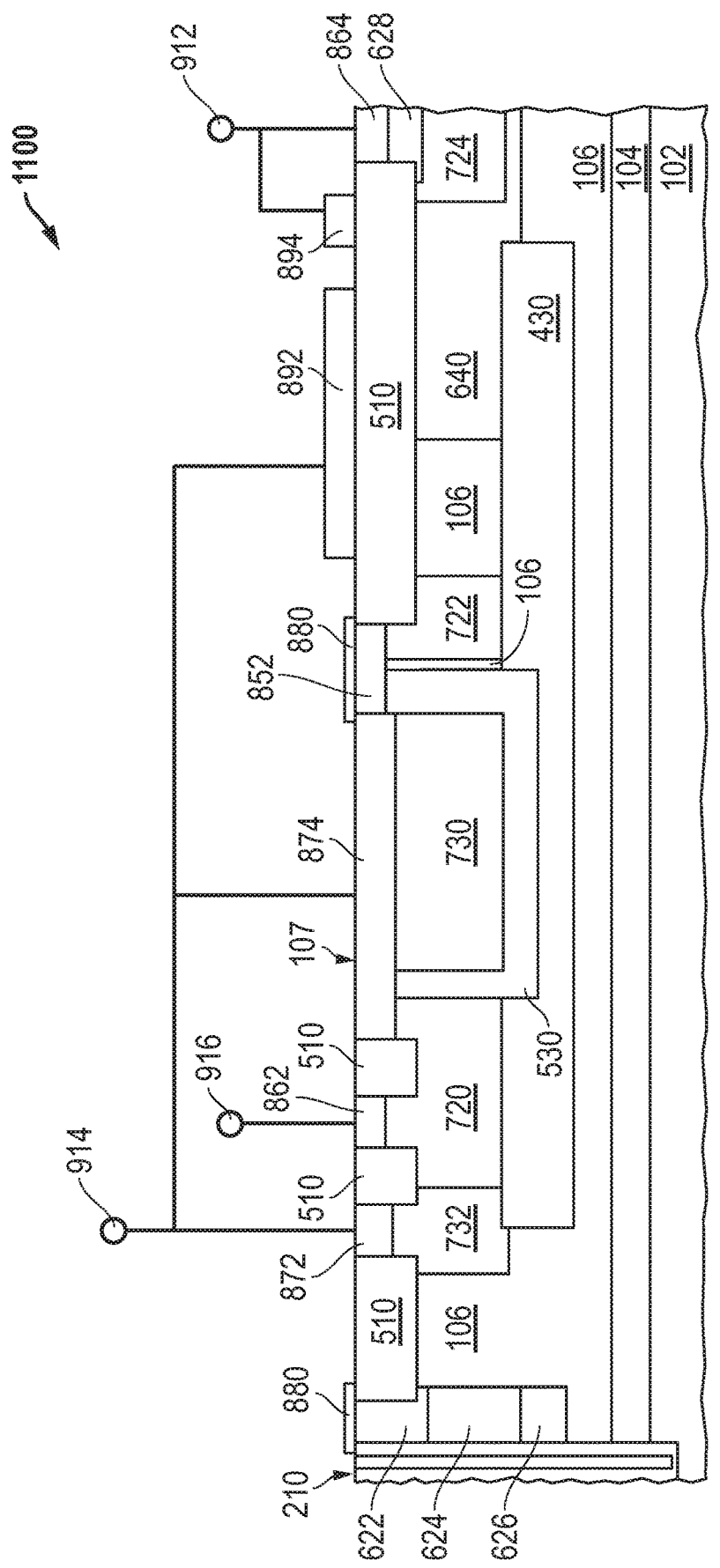
FIG. 12 includes an illustration of cross-sectional view of a portion of the JFET along sectioning line 12-12 in FIG. 11.
Figure 13:
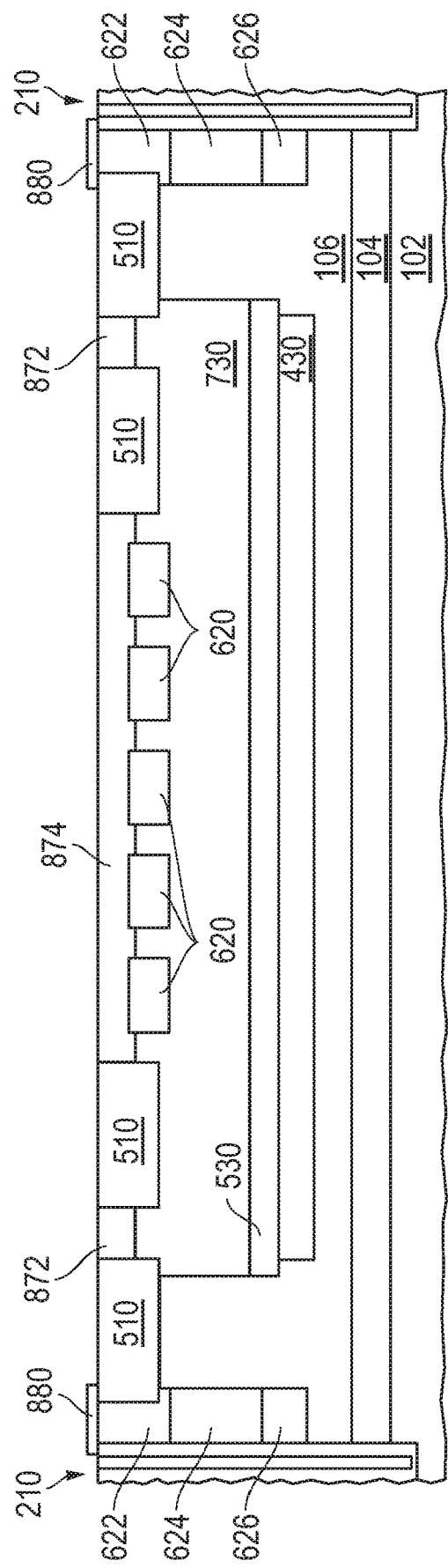
FIG. 13 includes an illustration of cross-sectional view of a portion of the JFET along sectioning line 13-13 in FIG. 11.

In an alternative embodiment, a JFET 1100 can include alternating gate and conduction channels 1140 and 1120 as illustrated in FIGS. 11 to 13. FIG. 11 includes a top view of a portion of the JFET 1100 that includes the source contact regions 862, the drain contact region 864, conduction channels 1120, and gate regions 1140, and other features that have been previously described. In FIG. 11, the sectioning line 1-1 corresponds to conduction channels 1120, which from a cross-sectional view is the same as illustrated in FIG. 1, the sectioning lines 12-12 corresponds to the gate regions 1140 in FIG. 12, and the sectioning line 13-13 correspond to FIG. 13. FIG. 12 is similar to FIG. 1, except that p-type doped region 620 is removed. FIG. 13 illustrates that the portions of the n-well region 730 of the gate regions 1140 are disposed laterally between the spaced apart p-type doped regions 620 corresponding to the conduction channels 1120.

Figure 14:
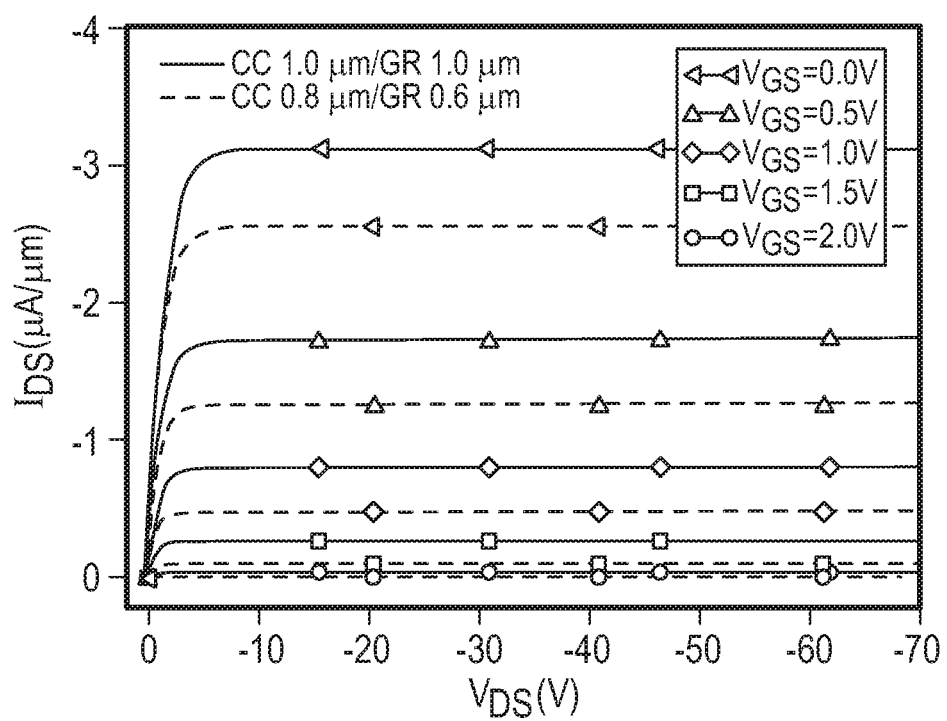
FIG. 14 includes plots of drain current as a function of drain voltage for different gate voltages for the JFET of FIGS. 11 to 13 when using different ratios of widths for channel conduction and gate regions.
Figure 15:
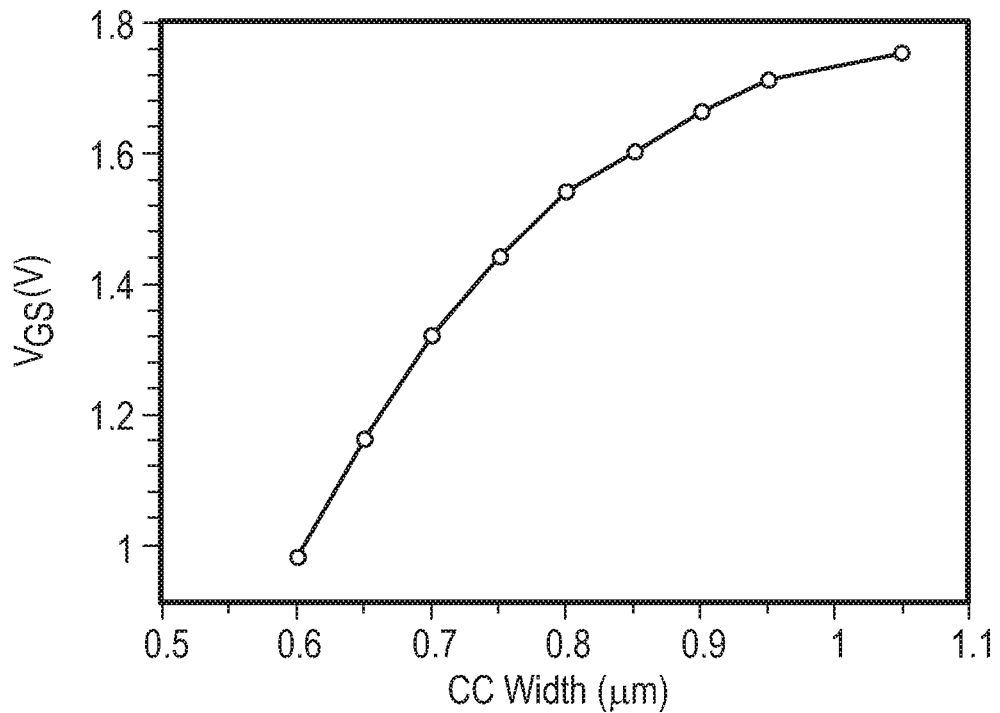
FIG. 15 includes a plot of pinch-off voltage as a function of the width of the channel conduction regions for the JFET of FIGS. 11 to 13 for a particular width of the gate region.

Different widths of the conduction channels 1120 and gate regions 1140 can affect the characteristics of the JFET 1100. FIG. 14 includes two different pairs of values for the widths of the conduction channels 1120 to the widths of the gate regions 1140. The solid lines correspond to widths of 1 micron for the conduction channels 1120 and widths of 1 micron for the widths of the gate regions 1140. The dashed lines correspond to widths of 0.8 micron for the conduction channels 1120 and widths of 0.6 micron for the widths of the gate regions 1140. The transistor having widths of 1 micron for the conduction channels 1120 and gate regions 1140 has higher $I_{DS}$ for each of the $V_{GS}$ values as compared to the transistor having widths of 0.8 micron for the conduction regions 1120 and 0.6 micron for the gate regions 1140. FIG. 15 includes a plot of pinch-off voltage as a function of the width of the conduction channels 1120. For the plot, the width of the gate regions is 0.8 micron. As can be seen in FIG. 15, the use of the conduction channels 1120 and gate regions 1140 can allow the pinch-off voltage to be reduced to less than 2.0 V, which is the pinch-off voltage for the JFET 100 of FIG. 1.

Figure 16:
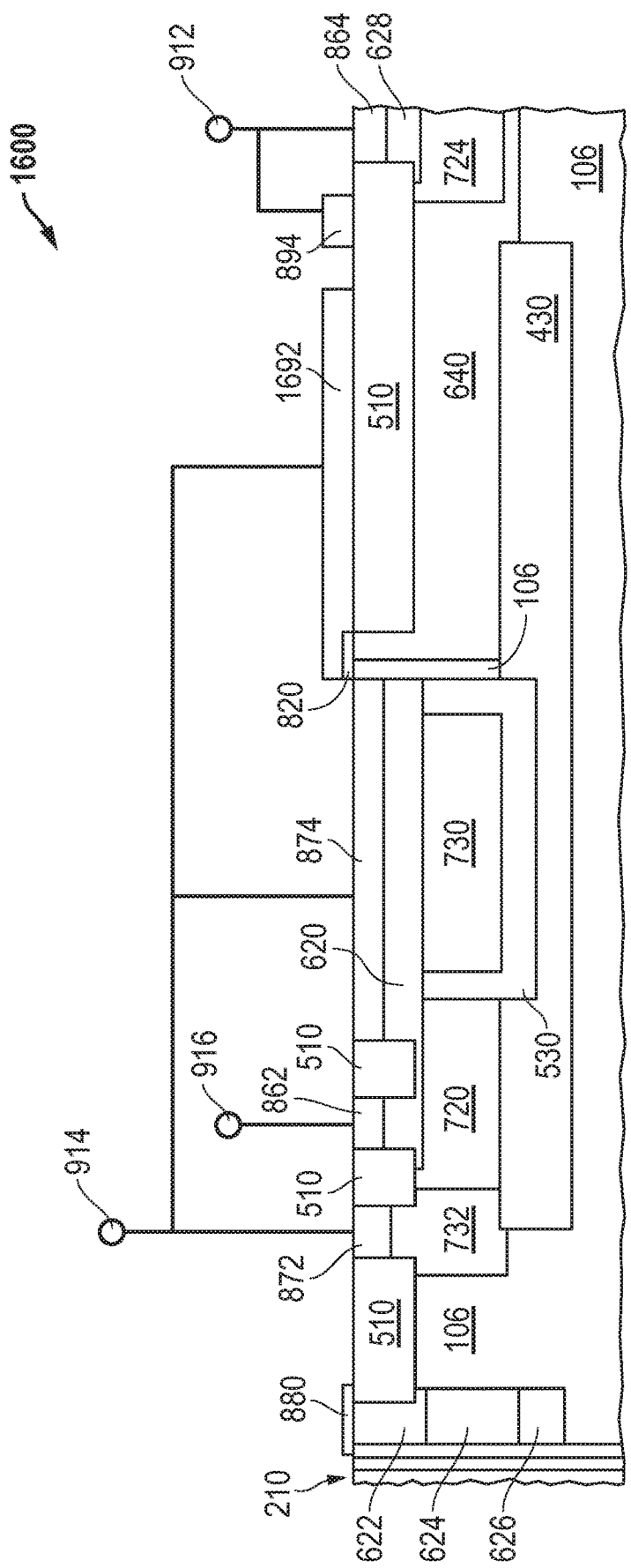
FIG. 16 includes an illustration of a cross-sectional view of a portion of an electronic device that includes a portion of a high-voltage JFET in accordance with an alternative embodiment.

FIG. 16 includes a further embodiment of a JFET 1600 that is similar to the JFET 100 of FIG. 1. In FIG. 16, the n-type extension region 852, the p-well region 722, and the portions of the semiconductor layer between the p-well regions 722 and the p-drift region 640 of JFET 100 (FIG. 1) are removed. The gate dielectric layer 820 overlies at least portions of the semiconductor layer 106 and p-type drift region 640 where the n-type extension region 852 would have been located. The gate field electrode 1692 extends over the portions of the semiconductor layer 106 and p-type drift region 640 where the n-type extension region 852 would have been located. In the JFET 1600, the combined lengths of the channel and p-type drift region 640 is approximately 25% smaller than the combined lengths of the channel, the p-well region 722, the portion of the semiconductor layer 106, and p-type drift region 640 of the JFET 100.

Figure 17:
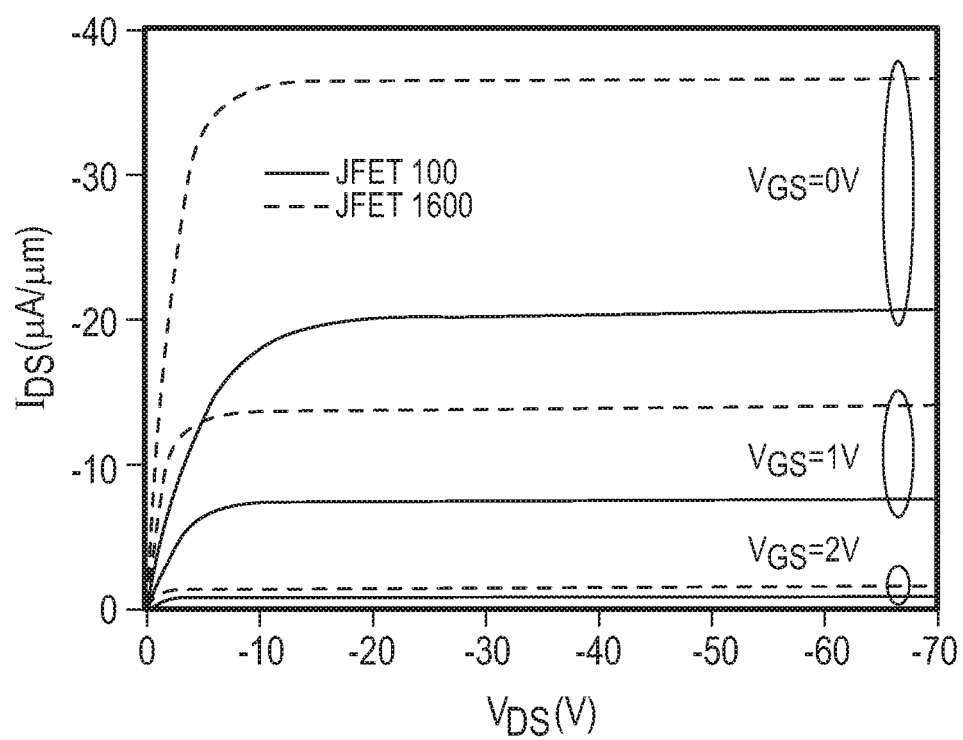
FIG. 17 includes plots of drain current as a function of drain voltage for the JFETs of FIGS. 1 and 16 at different gate voltages.

Many of the performance parameters are significantly better for the JFET 1600, as compared to the JFET 100. FIG. 17 includes plots of $I_{DS}$, expressed as a current density, as a function of $V_{DS}$ for the JFETs 100 and 1600 when a variety of different $V_{GS}$s are used. The solid line corresponds to the JFET of FIG. 1, and the dashed line corresponds to the JFET of FIG. 16. The JFET of FIG. 16 has substantially higher $I_{DSAT}$ at each of the different $V_{GS}$s.

However, the JFET 1600 can have a pinch-off voltage of approximately 2.4 V, which is significantly higher than 2.0 V, which is the pinch-off voltage for the JFET 100. In a further embodiment, the JFET 100 or 1600 can include the alternating conduction channels 1120 and gate regions 1140 as previously described with respect to FIGS. 11 to 13. Such a configuration may allow the JFET 1600 to have a pinch-off voltage of at most 2.0 V.

Other embodiments may be used. For example, the buried doped region 104 may not be used. In an embodiment, the buried oxide layer may be used, and the field isolation structure 210 can extend to the buried oxide layer. In another embodiment, the buried doped region 104 may be electrically connected to an external voltage source if the semiconductor layer 106 is sufficiently thick to sustain a desired voltage across the layer. For example, when the transistor has a voltage rating of 70 V, the desired voltage can be the voltage rating. In still another embodiment, when the semiconductor layer 106 is sufficiently thick, the n-type resurf region 430 may extend all the way under the drain contact region 864, such that the drain region is electrically isolated from the portion 1064 of the semiconductor layer 106, in such case the n-type buried doped region 104 may not be needed. In a further embodiment, conductivity types can be reversed. Accordingly, in such an embodiment, an n-channel JFET can be formed.

Many benefits can occur with embodiments as described herein. The tapered down n-type dopant concentration of the bottom gate region, and top gate region where applicable, reduces the likelihood that the channel of the JFET closes up due to a reduced p-type dopant concentration near the right-hand side of the channel as illustrated in FIG. 1. The tapering can be achieved by a plurality of n-type implants, such as those used to form the n-well region 730 and the n-type doped region 530.

In the embodiments as illustrated, the principal top gate region 874 can be pulled back from the field isolation structure 510 that underlies the field electrodes 892 and 894 to increase breakdown voltage and increase conduction when the JFET is in the on-state. The silicide mask 880 over this pull-back portion can be used to reduce the likelihood that the silicide shorts to the channel.

Similar to the n-type doped regions, the p-type dopant concentration of the channel can be reduced adjacent to the field isolation structure 510 that underlies the field electrodes 890 and 892 to increase breakdown voltage. As illustrated in FIG. 1, the p-type doped region 620 is pulled back from the field isolation structure 510 and has sufficient spacing between the p-type doped region 620 and the p-well region 722.

The portion of the semiconductor layer 106 is disposed between the p-well region 722 and the p-type drift region 640 (under the gate field electrode 890 in FIGS. 2 and 3) and has a dopant concentration lower than each of the p-well region 722 and the p-type drift region 640. The semiconductor layer 106 helps in attaining a high breakdown voltage, high output impedance, and low $R_{DSON}$.

A conventional JFET can include laterally spaced-apart well implants that pinch off a vertical portion of a conduction channel of the conventional JFET. Another conventional JFET can have alternating shallow conduction channel regions and deep conduction channels beneath gate regions. Such other conventional JFET also uses laterally spaced-apart well implants to achieve lateral, but not vertical, pinch off. The conduction channels of both conventional JFETs are not completely surrounded by the gate regions, and thus, they have a less than maximum pinching effect. For the both conventional JFETs, achieving a low pinch-off voltage and high output impedance is difficult because well regions need to laterally pinch off the vertical conduction channels. Further, the conventional JFETs do not have a laterally graded transition region or laterally graded drift region.

In contrast, embodiments as described herein do not have these limitations. With the embodiments as illustrated and described with respect to FIGS. 11 to 13, pinching of the conduction channels can occur in the lateral and vertical directions at the same time. Referring to FIG. 13, the conduction channels are completely surrounded by the top and bottom gate regions in all directions that are perpendicular to the length (current flowing) directions, which allows for the efficient pinching off of the conduction channel. Further, the channel of the JFET can be defined by a single shallow implant, which has a much better CD (critical dimension) control than a well implant as used in the prior art. This allows for tuning the pinch-off voltage more precisely with better repeatability.

Referring to the embodiment as illustrated in FIG. 16, the gate field electrode 1692 extends over the channel of the JFET 1600, allowing the top gate region to be pulled back from the field isolation structure 510. In the embodiment as illustrated, the principal top gate region 872 can be self-aligned to the gate field electrode 1692 and the n-type extension region 852 is not present. Compared to the JFET 100 of FIG. 1, the JFET 1600 does not have the p-well region 722 and the portion of the semiconductor layer 106 that is between the p-drift region 640 and top and bottom gate regions of the JFET 1600. Thus, the lateral offset between the drain contact region 864 and the gate regions of the JFET 1600 can be reduce and result in the JFET 1600 occupying less area of the electronic device, as compared to the JFET 100.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1. An electronic device can include a junction field-effect transistor including a drain contact region having a first conductivity type; a channel region spaced apart from the drain contact region and having the first conductivity type; and a first gate region adjacent the channel region and having a second conductivity type opposite the first conductivity type. The first gate region can include a first portion and a second portion, the second portion is disposed between the first portion and the drain contact region, and the second portion has a lower dopant concentration as compared to the first portion.

Embodiment 2. The electronic device of Embodiment 1, wherein the junction field-effect transistor further includes a second gate region, wherein the first portion of the first gate region underlies the channel region, and the second gate region overlies the channel region.

Embodiment 3. The electronic device of Embodiment 2, wherein the second gate region includes a first portion and a second portion, the second portion of the second gate electrode is disposed between the first portion of the second gate region and the drain contact region, and the second portion of the second gate region has a lower dopant concentration as compared to the first portion of the second gate region.

Embodiment 4. The electronic device of Embodiment 2, wherein the junction field-effect transistor further includes a source contact region having the first conductivity type; and a first field isolation structure disposed between the source region and the channel region, wherein the first gate region is laterally offset from the first field isolation region.

Embodiment 5. The electronic device of Embodiment 2, wherein the junction field-effect transistor further includes a first doped region having the first conductivity type; and a second doped region having the first conductivity type. The first doped region can have a lower dopant concentration as compared to the second doped region, the channel region can be closer to the first doped region than to the second doped region, and the drain contact region can be closer to the second doped region than to the first doped region.

Embodiment 6. The electronic device of Embodiment 5, wherein the first doped region is spaced apart from the channel region.

Embodiment 7. The electronic device of Embodiment 5, wherein the junction field-effect transistor further includes a resurf region having the second conductivity type, wherein at least portions of each of the first and second doped regions overlie the resurf region.

Embodiment 8. The electronic device of Embodiment 7, wherein the resurf region is laterally offset from the drain contact region.

Embodiment 9. The electronic device of Embodiment 7, wherein the junction field-effect transistor further includes a gate connection region having the second conductivity type and contacting the resurf region.

Embodiment 10. The electronic device of Embodiment 5, wherein the junction field-effect transistor further includes a field electrode coupled to a gate terminal, wherein the field electrode overlies at least portions of the first and second doped regions.

Embodiment 11. The electronic device of Embodiment 5, wherein each of the first and second doped regions are closer to the channel region than to the drain contact region.

Embodiment 12. The electronic device of Embodiment 5, wherein the junction field-effect transistor further includes a third doped region having the first conductivity type, wherein drain contact region is closer to the third doped region than to the first and second doped regions and has a dopant concentration that is between dopant concentrations of the first and second doped regions.

Embodiment 13. The electronic device of Embodiment 5, wherein the junction field-effect transistor further includes a field isolation structure spaced apart from the first portion of the second gate region by a spaced-apart region, and a field electrode coupled to a gate terminal and overlying the field isolation structure and the spaced-apart region.

Embodiment 14. The electronic device of Embodiment 13, wherein the spaced-apart region has the first conductivity type.

Embodiment 15. The electronic device of Embodiment 1 can further include an insulated gate field-effect transistor spaced apart from the junction field-effect transistor; a floating buried doped region underlying the junction field-effect transistor; and a field isolation structure extending at least through the floating buried doped region, wherein field isolation structure is disposed between the junction field-effect transistor and the insulated gate field-effect transistor.

Embodiment 16. An electronic device can include a junction field-effect transistor including a first channel region having a first conductivity type, and a gate having a second conductivity type opposite the first conductivity type, wherein, in the width direction, the gate surrounds the first channel region.

Embodiment 17. The electronic device of Embodiment 16 can further include a second channel region, wherein the second channel region is spaced apart from the first channel, in the width direction, the gate surrounds the second channel region, and the gate includes a top gate region that overlies the first and second channel regions and a bottom gate electrode that includes a well region.

Embodiment 18. The electronic device of Embodiment 17, wherein the bottom gate region includes a first portion and a second portion, the second portion is disposed between the first portion and the drain contact region, and the second portion has a lower dopant concentration as compared to the first portion.

Embodiment 19. A process of forming an electronic device including a junction field-effect transistor. The method can include forming a first portion of a gate region within a semiconductor layer, wherein the first portion of the gate region has a first conductivity type; forming a second portion of the gate region within the semiconductor layer, wherein the second portion has the first conductivity type; and forming a drain contact region within the semiconductor and having a second conductivity type opposite the first conductivity type. In a finished device, the second portion of the gate region can be disposed between the first portion of the gate region and the drain contact region, the second portion can have a lower dopant concentration as compared to the first portion, a channel region of the junction field-effect transistor can have a second conductivity type opposite the first conductivity type, and each of the channel region and the gate region can be spaced apart from the drain contact region.

Embodiment 20. The process of Embodiment 19 can further include forming the semiconductor layer having the second conductivity type and a background dopant concentration; forming a first doped region within the semiconductor layer, wherein the first doped region has the second conductivity type and a dopant concentration higher than the background dopant concentration; forming a second doped region within the semiconductor layer; and forming a source contact region. In a finished device a portion of the semiconductor layer having the background dopant concentration can be disposed between the first and second doped regions, the portion of the semiconductor layer and the first and second doped regions can be disposed between the channel region and the drain contact region, and each of the channel region, first doped region, the portion of the semiconductor layer, and the second doped region can be along a conduction path between the source contact region and the drain contact region.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. An electronic device comprising:
   a junction field-effect transistor including:
      a drain contact region having a first conductivity type;
      a channel region spaced apart from the drain contact region and having the first conductivity type; and
      a first gate region adjacent the channel region and having a second conductivity type opposite the first conductivity type, wherein:
         the first gate region includes a first portion and a second portion,
         the first portion underlies the channel region,
         the second portion underlies the channel region and is disposed between the first portion and the drain contact region, and
         the second portion has a lower dopant concentration as compared to the first portion.

2. The electronic device of claim 1, wherein the junction field-effect transistor further comprises a second gate region overlying the channel region.

3. The electronic device of claim 2, wherein the second gate region includes a first portion and a second portion, the second portion of the second gate electrode is disposed between the first portion of the second gate region and the drain contact region, and the second portion of the second gate region has a lower dopant concentration as compared to the first portion of the second gate region.

4. The electronic device of claim 1, wherein the first portion of the first gate region and the second portion of the first gate region contact the channel region.

5. The electronic device of claim 1, wherein the junction field-effect transistor further comprises:
   a first doped region having the first conductivity type; and
   a second doped region having the first conductivity type, wherein:
      the first doped region has a lower dopant concentration as compared to the second doped region,
      the channel region is closer to the first doped region than to the second doped region, and
      the drain contact region is closer to the second doped region than to the first doped region.

6. The electronic device of claim 5, wherein the first doped region is spaced apart from the channel region.

7. The electronic device of claim 5, wherein the junction field-effect transistor further comprises a resurf region having the second conductivity type, wherein at least portions of each of the first and second doped regions overlie the resurf region.

8. The electronic device of claim 7, wherein the resurf region is laterally offset from the drain contact region.

9. The electronic device of claim 7, wherein the junction field-effect transistor further comprises a gate connection region having the second conductivity type and contacting the resurf region.

10. The electronic device of claim 5, wherein the junction field-effect transistor further comprises a field electrode coupled to a gate terminal, wherein the field electrode overlies at least portions of the first and second doped regions.

11. The electronic device of claim 5, wherein each of the first and second doped regions are closer to the channel region than to the drain contact region.

12. The electronic device of claim 5, wherein the junction field-effect transistor further comprises a third doped region having the first conductivity type, wherein drain contact region is closer to the third doped region than to the first and second doped regions and has a dopant concentration that is between dopant concentrations of the first and second doped regions.

13. The electronic device of claim 5, wherein the junction field-effect transistor further comprises:
    a second gate region overlying the channel region;
    a field isolation structure spaced apart from the first portion of the second gate region by a spaced-apart region; and
    a field electrode coupled to a gate terminal and overlying the field isolation structure and the spaced-apart region.

14. The electronic device of claim 13, wherein the spaced-apart region has the first conductivity type.

15. The electronic device of claim 1, further comprising:
    an insulated gate field-effect transistor spaced apart from the junction field-effect transistor;
    a floating buried doped region underlying the junction field-effect transistor; and
    a field isolation structure extending at least through the floating buried doped region, wherein field isolation structure is disposed between the junction field-effect transistor and the insulated gate field-effect transistor.

16. An electronic device comprising:
    a junction field-effect transistor including:
        a first channel region having a first conductivity type;
        a second channel region spaced apart from the first channel region;
        a gate having a second conductivity type opposite the first conductivity type,
        wherein:
            the gate includes a top gate region and a bottom gate region,
            the bottom gate region includes a well region, and
            the bottom gate region includes a first portion and a second portion; and
    a drain contact region,
    wherein:
        the first channel region has a length and a width,
        the length is in a direction of on-state current flow through the first channel region,
        the width is in a direction perpendicular to the length,
        in the width direction, the gate completely surrounds at least a portion of the first channel region, and the gate surrounds the second channel region,
        the top gate region overlies the first channel region and the second channel region,
        the second portion of the bottom gate region is disposed between the first portion of the bottom gate region and the drain contact region,
        the second portion of the bottom gate region has a lower dopant concentration as compared to the first portion of the bottom gate region.

17. An electronic device including a junction field-effect transistor comprising:
    a drain contact region within a semiconductor layer and having a first conductivity type;
    a source contact region within the semiconductor layer and having the first conductivity type;
    a first doped region within the semiconductor layer and having the first conductivity type and a first dopant concentration; and
    a second doped region within the semiconductor layer and having the first conductivity type and a second dopant concentration that is less than the first dopant concentration,
    wherein:
        the junction-field effect transistor has an on-state current path between the drain contact region and the source contact region,
        the first doped region is at a first part of the on-state current path within the junction field-effect transistor,
        the second doped region is at a second part of the on-state current path within the junction field-effect transistor, and
        the first part of the on-state current path is between the drain contact region and the second part of the on-state current path.

18. The electronic device of claim 17, further comprising:
    a third doped region within the semiconductor layer and having the first conductivity type and a third dopant concentration that is greater than the second dopant concentration; and
    a field isolation structure overlying the first doped region, wherein the field isolation structure has a corner that contacts the third doped region,
    wherein:
        the third doped region is at a third part of the on-state current path,
        the second part of the on-state current path is between the first part and the third part of the on-state current path, and
        the drain contact region has a drain dopant concentration that is greater than each of the first dopant concentration, the second dopant concentration, and the third dopant concentration.

* * * * *